(12) United States Patent
Yamazaki et al.

(10) Patent No.: US 8,508,682 B2
(45) Date of Patent: Aug. 13, 2013

(54) PEELING METHOD AND METHOD FOR MANUFACTURING DISPLAY DEVICE USING THE PEELING METHOD

(75) Inventors: Shunpei Yamazaki, Setagaya (JP); Toru Takayama, Atsugi (JP); Junya Maruyama, Ebina (JP); Yuugo Goto, Atsugi (JP); Yumiko Ohno, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/547,360

(22) Filed: Jul. 12, 2012

(65) Prior Publication Data

US 2012/0295375 A1 Nov. 22, 2012

Related U.S. Application Data

(60) Continuation of application No. 12/720,761, filed on Mar. 10, 2010, now Pat. No. 8,228,454, and a continuation of application No. 11/797,535, filed on May 4, 2007, now Pat. No. 7,714,950, which is a division of application No. 10/752,574, filed on Jan. 8, 2004, now Pat. No. 7,245,331.

(30) Foreign Application Priority Data

Jan. 15, 2003 (JP) ................. 2003-007612
Jan. 15, 2003 (JP) ................. 2003-007629

(51) Int. Cl.
*G02F 1/136* (2006.01)
(52) U.S. Cl.
USPC ............... 349/45; 438/458; 438/187

(58) Field of Classification Search
None
See application file for complete search history.

(56) References Cited

U.S. PATENT DOCUMENTS

| 4,104,584 A | 8/1978 | Miyai et al. |
| 5,206,749 A | 4/1993 | Zavracky et al. |

(Continued)

FOREIGN PATENT DOCUMENTS

| CN | 1231065 | 10/1999 |
| EP | 0 849 788 | 6/1998 |

(Continued)

OTHER PUBLICATIONS

European Search Report dated Dec. 14, 2004 for Application No. 03010502.7.

(Continued)

*Primary Examiner* — Thanh-Nhan P Nguyen
(74) *Attorney, Agent, or Firm* — Eric J. Robinson; Robinson Intellectual Property Law Office, P.C.

(57) ABSTRACT

The present invention provides a simplifying method for a peeling process as well as peeling and transcribing to a large-size substrate uniformly. A feature of the present invention is to peel a first adhesive and to cure a second adhesive at the same time in a peeling process, thereby to simplify a manufacturing process. In addition, the present invention is to devise the timing of transcribing a peel-off layer in which up to an electrode of a semiconductor are formed to a predetermined substrate. In particular, a feature is that peeling is performed by using a pressure difference in the case that peeling is performed with a state in which plural semiconductor elements are formed on a large-size substrate.

33 Claims, 16 Drawing Sheets

(56) References Cited

U.S. PATENT DOCUMENTS

| | | |
|---|---|---|
| 5,391,257 A | 2/1995 | Sullivan et al. |
| 5,834,327 A | 11/1998 | Yamazaki et al. |
| 6,100,166 A | 8/2000 | Sakaguchi et al. |
| 6,127,199 A | 10/2000 | Inoue et al. |
| 6,362,086 B2 | 3/2002 | Weimer et al. |
| 6,372,608 B1 | 4/2002 | Shimoda et al. |
| 6,426,274 B1 | 7/2002 | Tayanaka |
| 6,521,511 B1 * | 2/2003 | Inoue et al. .................. 438/458 |
| 6,534,382 B1 | 3/2003 | Sakaguchi et al. |
| 6,559,905 B1 | 5/2003 | Akiyama |
| 6,645,830 B2 | 11/2003 | Shimoda et al. |
| RE38,466 E | 3/2004 | Inoue et al. |
| 6,700,631 B1 | 3/2004 | Inoue et al. |
| 6,781,152 B2 | 8/2004 | Yamazaki |
| 6,806,918 B2 | 10/2004 | Akiyama |
| 6,818,530 B2 | 11/2004 | Shimoda et al. |
| 6,872,635 B2 | 3/2005 | Hayashi et al. |
| 6,878,607 B2 | 4/2005 | Inoue et al. |
| 6,885,389 B2 | 4/2005 | Inoue et al. |
| 6,916,681 B2 | 7/2005 | Asano et al. |
| 7,050,125 B2 | 5/2006 | Akiyama |
| 7,060,153 B2 | 6/2006 | Yamazaki et al. |
| 7,094,665 B2 | 8/2006 | Shimoda et al. |
| 7,119,364 B2 | 10/2006 | Yamazaki |
| 7,147,740 B2 | 12/2006 | Takayama et al. |
| 7,179,693 B2 | 2/2007 | Asano et al. |
| 7,195,687 B2 | 3/2007 | Hayashi et al. |
| 7,205,212 B2 | 4/2007 | Hayashi et al. |
| 7,205,213 B2 | 4/2007 | Hayashi et al. |
| 7,205,214 B2 | 4/2007 | Hayashi et al. |
| 7,332,381 B2 | 2/2008 | Maruyama et al. |
| 7,550,326 B2 | 6/2009 | Asano et al. |
| 7,666,719 B2 | 2/2010 | Takayama et al. |
| 7,862,677 B2 | 1/2011 | Nakajima et al. |
| 2001/0014522 A1 | 8/2001 | Weimer et al. |
| 2002/0196389 A1 | 12/2002 | Koyama |
| 2003/0008437 A1 | 1/2003 | Inoue et al. |
| 2003/0032210 A1 | 2/2003 | Takayama et al. |
| 2003/0203547 A1 | 10/2003 | Sakaguchi et al. |
| 2006/0207714 A1 | 9/2006 | Yamazaki et al. |
| 2007/0048891 A1 | 3/2007 | Hayashi et al. |
| 2007/0082430 A1 | 4/2007 | Yamazaki |

FOREIGN PATENT DOCUMENTS

| | | |
|---|---|---|
| EP | 0 858 110 | 8/1998 |
| EP | 0 924 769 | 6/1999 |
| EP | 1 014 452 | 6/2000 |
| EP | 1 122 794 | 8/2001 |
| EP | 1 351 308 | 10/2003 |
| EP | 1 686 626 | 8/2006 |
| JP | 05-243519 | 9/1993 |
| JP | 09-105896 | 4/1997 |
| JP | 10-125929 | 5/1998 |
| JP | 10-125930 | 5/1998 |
| JP | 10-177187 | 6/1998 |
| JP | 10-239675 | 9/1998 |
| JP | 11-243209 | 9/1999 |
| JP | 11-265155 | 9/1999 |
| JP | 2000-235348 | 8/2000 |
| JP | 2000-241822 | 9/2000 |
| JP | 2000-241823 | 9/2000 |
| JP | 2000-248243 | 9/2000 |
| JP | 2001-007340 | 1/2001 |
| JP | 2001-051296 | 2/2001 |
| JP | 2001-125138 | 5/2001 |
| JP | 2001-189460 | 7/2001 |
| JP | 2001-189460 A | 7/2001 |
| JP | 2001-247827 | 9/2001 |
| JP | 2001-272923 | 10/2001 |
| JP | 2001-290439 | 10/2001 |
| JP | 2001-331120 | 11/2001 |
| JP | 2001-331120 A | 11/2001 |
| JP | 2002-031818 | 1/2002 |
| JP | 2002-033464 | 1/2002 |
| JP | 2002-217391 | 8/2002 |
| JP | 2002-277859 | 9/2002 |
| JP | 2002-289861 | 10/2002 |
| JP | 2003-007986 | 1/2003 |
| KR | 2001-0006448 | 1/2001 |
| TW | 382820 | 2/2000 |
| TW | 490717 | 6/2002 |
| WO | WO 98/09333 | 3/1998 |
| WO | WO 99/44242 | 9/1999 |
| WO | WO 02-084739 | 10/2002 |

OTHER PUBLICATIONS

Corrected Page of International Search Report, Application No. PCT/JP03/16540.

International Search Report, Application No. PCT/JP03/16540, dated Mar. 30, 2004.

International Preliminary Examination Report, Application No. PCT/JP03/16540, dated Apr. 27, 2004.

Korean Office Action (Application No. 2005-7013208) dated Aug. 31, 2010.

Taiwanese Office Action (Application No. 93100154) dated Mar. 22, 2011.

* cited by examiner 10 nm 10 nm 10 nm 10 nm 207, 206, 204, 205, 202, 201, 203, 200

210

211, 212

214, 215

220, 221

222, 223

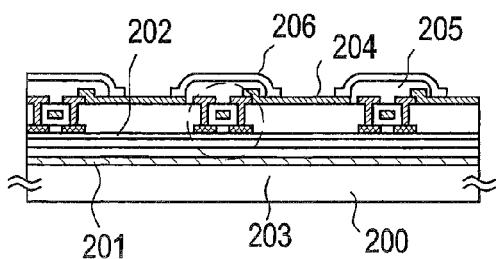
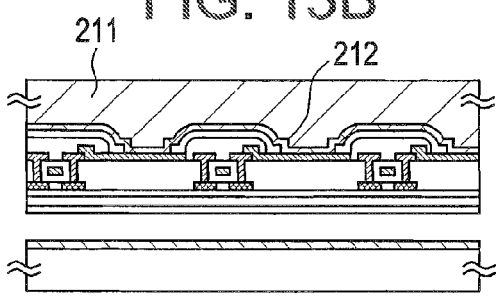
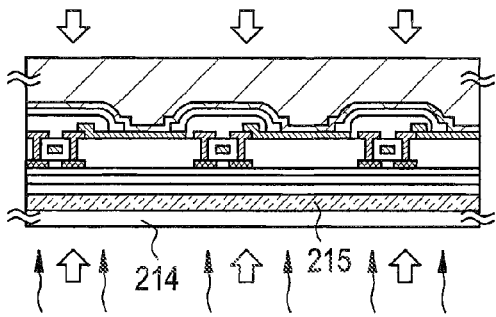
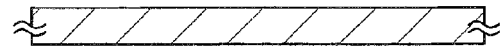
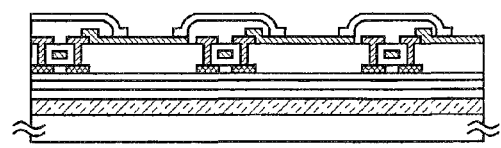
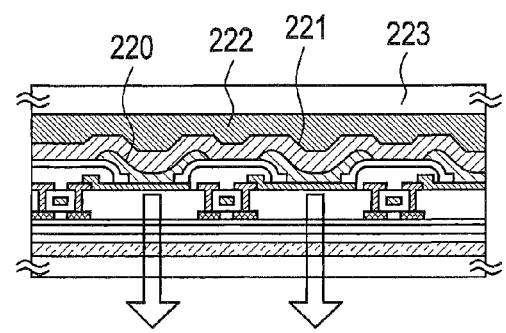

PEELING METHOD AND METHOD FOR MANUFACTURING DISPLAY DEVICE USING THE PEELING METHOD

TECHNICAL FIELD

The present invention relates to a peeling method of a functional thin film, specifically relates to a peeling method of a film or a layer having various elements. In addition, the present invention relates to a transferring method for pasting a peeled film to a film substrate, a semiconductor device and method for manufacturing thereof having a thin film transistor (hereinafter, referred to as a TFT) formed by using the transferring method.

BACKGROUND ART

In recent years, attention has been paid to a technique of comprising a TFT by using a semiconductor thin film (thickness of around several to several hundreds nm) formed over a substrate having an insulating surface. A TFT is widely applied to an electronics device such as an IC or an electro-optical device, and is under development especially as a switching element or a driver circuit of a display device.

Although a glass substrate or quartz substrate is often used in the display device, it is easily broken and heavy, which are defects. Therefore, a glass substrate or quarts substrate is difficult to enlarge in a mass production. Hence, forming a TFT element on a substrate with flexibility, typically, on a flexible plastic film is attempted.

However, when a high-performance polycrystalline silicon film is used for an active layer of a TFT, a high temperature process of several hundred degrees Celsius is necessary in a manufacturing process; thereby it can not be directly formed on a plastic film.

Therefore, a method for peeling a peel-off layer existing on a substrate through a separating layer from the substrate is proposed. For example, it is a method for providing a separating layer comprising amorphous silicon, a semiconductor, nitride ceramics or organic polymer, then to radiate laser light through a substrate to generate a peeling in layer in the separating layer, followed by separating the substrate. (see the patent document 1).

Additionally, there is also a description that a liquid crystal display device is completed by pasting a peel-off layer (referred to as a layer to be transferred in the gazette) to a plastic film using the technique (see the patent document 2). In addition, when articles regarding a flexible display are looked, technologies of each company are introduced. (see the non-patent document 1).
Patent Document 1
Unexamined Patent Publication No. 10-125929 gazette
Patent Document 2
Unexamined Patent Publication No. 10-125930 gazette
Non-Patent Document 1
Nikkei Microdevice, Nikkei BP, No. Jul. 1, 2002, Jul. 1, 2002, pages 71 to 72

DISCLOSURE OF INVENTION

However, there were a lot of problems in the aforementioned peeling process, and there was a room of improvement. In addition, it is needed to consider how to perform uniformly to a large-size substrate.

Therefore, the present invention provides a method for simplifying a peeling process as well as to conduct it easily. Additionally, the present invention provides a light emitting device, a crystal display device, and other types of display devices formed by the aforementioned method.

In view of the aforementioned object, a feature of the present invention is to simplify a manufacturing process by peeling a first adhesive and curing a second adhesive in a peeling process at the same time. In addition, a feature of the present invention is to simplify a manufacturing process by devising the timing of transcribing a peel-off layer to a predetermined substrate.

Moreover, it is preferable to cause a physical damage or to expose a cross-section of a peel-off layer in order to simplify peeling of the peel-off layer.

In addition, when peeling in a condition that plural semiconductor elements are formed particularly on a large substrate, a feature is that a substrate is absorbed using difference in pressure and is peeled to raise precision and accuracy of peeling.

Specifically, as shown in FIG. 1(A), a peel-off layer 101 is formed on a first substrate 100. A semiconductor element, an electrode, additionally, display function including a liquid crystal layer (a liquid crystal element) or a light emitting layer (a light emitting element), a driving circuit and the like may be included in a peel-off layer finally. A practitioner can determine a relation between peeling timing and manufacturing state of a peel-off layer. For example, the peel-off layer in FIG. 1(A) may be a state in which a semiconductor element and an electrode connected to the semiconductor element are formed, or a state in which a liquid crystal element or a light emitting element are further formed.

The first substrate may have rigidity that can withstand following peeling process, and for example, a glass substrate, a quartz substrate, a ceramic substrate, a silicon substrate, a metal substrate or a stainless steel substrate may be used.

Furthermore, a semiconductor element of a peel-off layer may be a TFT having an amorphous semiconductor film, an organic TFT, a thin film diode, a photoelectric conversion element comprising a PIN junction of silicon, a silicon resistor element, a sensor element (typically a pressure-sensitive finger print sensor using polycrystalline silicon), or the like. Additionally, if it is a TFT, it may be either a bottom gate type or a top gate type.

Then, as shown in FIG. 1(B), a stress relaxation material 103 is formed on a peel-off layer. The stress relaxation material is not necessary in a peeling process, but it is preferable to provide in order to protect the peel-off layer. A water-soluble resin, a thermosetting resin, a photo-curing resin, or other resin may be used as a stress relaxation material. In other words, an organic resin with high flexibility is preferable in order to protect a peel-off layer, and moreover, considering removing it eventually, it also may be a material that is removed physically, but a material in which adhesiveness decreases due to water washing, heat or light is preferable.

Next, as shown in FIG. 1(C), it is preferable to divide the first substrate, the semiconductor element and the stress relaxation material in order to simplify peeling of the peel-off layer. A laser, a cutter or the like can be used as a dividing method.

It is preferable to expose a cross-section of a boundary face to be separated in order to simplify peeling even though a cross-section process is not necessary in a peeling process. It may also be possible to scratch on a cross-section surface of a boundary face to be separated by a physical means such as a cutter. In addition, the peel-off layer or the stress relaxation material may be cut in without separating the first substrate.

As shown in the FIG. 1(D), a second substrate 105 is pasted on the peel-off layer afterwards. At this time, although it is fixed by using a first adhesive 106, when there is an adhesion function in a substrate in itself, an adhesive is not necessary. It is preferable that a substrate with higher rigidity than that of the first substrate be used for the second substrate, and a quartz substrate may be utilized since it has comparatively high rigidity. As the first adhesive, a peelable adhesive, for example, an ultraviolet peelable adhesive in which adhesiveness is weakened or which is peeled by an ultraviolet ray, a heat peelable adhesive in which adhesiveness is weakened or which is peeled by heat, a water-soluble adhesive or a two-sided tape in which adhesiveness is weakened or which is peeled by water washing, or the Ike may be used.

In addition, an auxiliary substrate 108 may be provided under the first substrate to further assure a peeling process. An adhesive 107 is used for fix the substrate when the auxiliary substrate is not provided with adhesiveness. In addition, the identical adhesive may be used for fix the second substrate and the auxiliary substrate, and the first adhesive and the auxiliary substrate.

Then, as shown in the FIG. 1(E), peeling is conducted by using a physical means. When the auxiliary substrate is provided as shown in FIG. 1(E), each of the second substrate and the auxiliary substrate may be added with power working towards the reverse directions, and when the auxiliary substrate is not provided, it may be peeled by fixing a sheet with high adhesiveness under the first substrate.

When it is a large-size substrate, in particular, the substrate may be absorbed using difference in pressure to peel uniformly. In other words, for example, a substrate to be peeled is provided on a substrate in which a vacancy is formed, the vacancy is in the decompression or vacuum state by a pump or the like, and a peeling may be conducted in the state that the entire substrate to be peeled is fixed uniformly by difference in pressure.

Then as shown in FIG. 2(F), a third substrate 110 is fixed under the peeled layer. When the third substrate does not have adhesiveness in itself, it is adhered through a second adhesive 111. As the third substrate, a substrate with a thin film thickness or a substrate with flexibility (flexible) (hereinafter referred to as a film substrate) such as a plastic substrate such as polycarbonate, polyarylate, polyethersulfone, a polytetrafluoroethylene substrate or a ceramic substrate may be used. As the second adhesive, an ultraviolet curable resin or a thermosetting resin can be used. However, the first adhesive and the second adhesive need to have opposite features by an ultraviolet ray, heat or the like. In other words, adhesiveness of the first substrate should be weakened or the substrate should be peeled and the second substrate should be cured due to an ultraviolet ray or heat. In FIG. 2(F), adhesiveness of the first adhesive is weakened and the second adhesive is cured by being irradiating with an ultraviolet ray. In addition, an ultraviolet ray may be radiated both from top and bottom of the peeled layer or from one side of the peel-off layer. Then, as shown in FIG. 2(G), the second substrate is peeled.

In this way, a peeling process can be simplified as peeling and fixing can be conducted at the same time by the identical process such as radiating an ultraviolet ray or applying heat.

Then, as shown in FIG. 2(H), the stress relaxation material is removed by being irradiated with an ultraviolet ray, heating or water washing. Moreover, it is preferable to perform plasma cleaning using an argon gas and an oxygen gas or bellclean cleaning to remove more precisely. At this time, as the stress relaxation material, a material which can be removed in the same step of the first adhesive may be used In other words, a material which can be removed by an ultraviolet ray is used as the stress relaxation material, and peeling of the first adhesive, curing of the second adhesive, and removing of the stress relaxation material can be performed simultaneously. Then, as shown in FIG. 2(I), transferring of the peeled layer to the third substrate is completed.

A peeling process repeating the removal and curing of the adhesive for transferring can be simplified by using the peeling methods. Therefore, in the peeling process of the present invention, it can be formed with a preferable yield since an entire peel-off layer can be peeled. By peeling an entire peel-off layer, plural semiconductor elements can be formed on one large-size substrate and a gang printing which cut the substrate every semiconductor device can be performed; thereby cost reduction can be expected. In addition, the first substrate and the like can be recycled; thereby a low cost display device can be achieved to utilize far more inexpensive film substrate.

As a result, a light emitting device, a liquid crystal display device and other display device having the TFT or the like are made thin, hard to damage even in being dropped and light-weight. In addition, display on a curved surface or heteromorphic surface is made possible.

Peeling (including adhesiveness reduction) or curing of an adhesive can be performed by the same process (ultraviolet ray irradiation and heating) according to the present invention. Consequently, a manufacturing process of a display device in addition to a peeling process can be simplified. Moreover, when plural display devices are manufactured from a large-size substrate, besides the peeling process of the present invention, a process of peeling or transferring can be performed accurately and simply by a pressure reduction device or the like. In this way, the number of a manufacturing steps is reduced by the peeling process of the present invention, and displays can be produced in large quantities with a preferable yield.

BRIEF DESCRIPTION OF DRAWINGS

FIG. 11 is a drawing

FIGS. 13A to 13E are drawings of manufacturing a light emitting device according to a peeling process of the present invention.

BEST MODE FOR CARRYING OUT THE INVENTION

Embodiment modes of the present invention are described on the basis of drawings hereinafter. In addition, in all drawings for describing the embodiment mode, the same code is used in the same part or a part having the same function to omit the repetition of explanation.

Embodiment Mode 1

In the present embodiment mode, a peel-off layer is in a state in which up to a light emitting element and a liquid crystal element are formed, and an example of a specific peeling process in the case of performing peeling and transferring and of forming a top emission light emitting device according to the peeling process of the present invention is described.

Figure 1A:
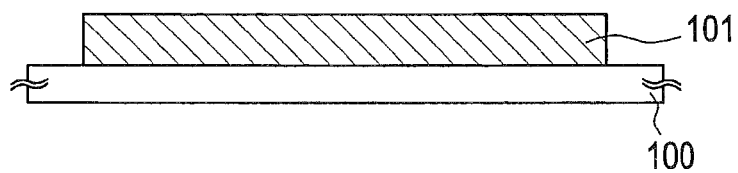
FIGS. 1A to 1E are drawings of explaining a peeling process of the present invention.
Figure 1B:
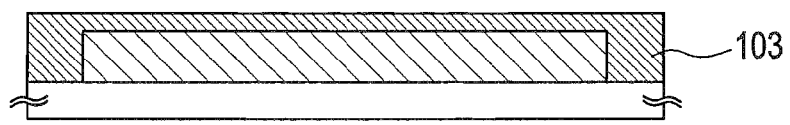
Figure 1C:
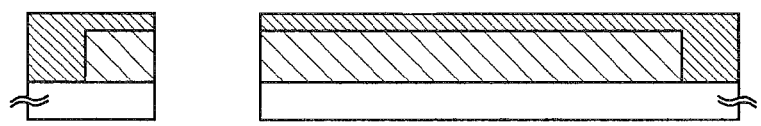
Figure 1D:
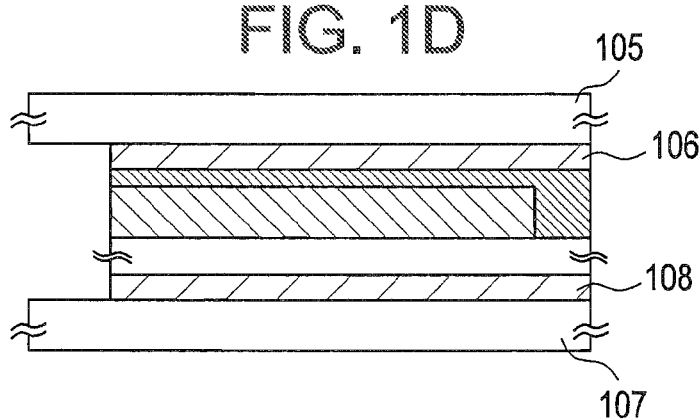
Figure 1E:
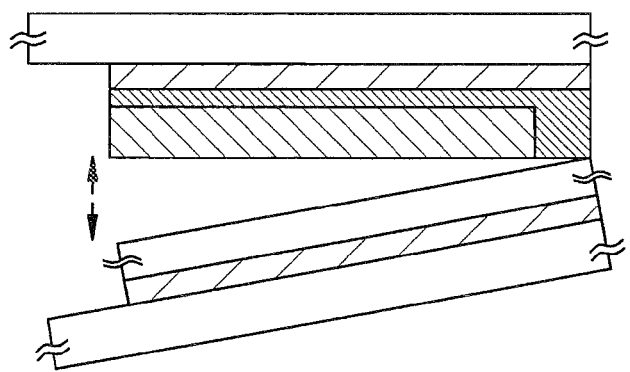
Figure 2F:
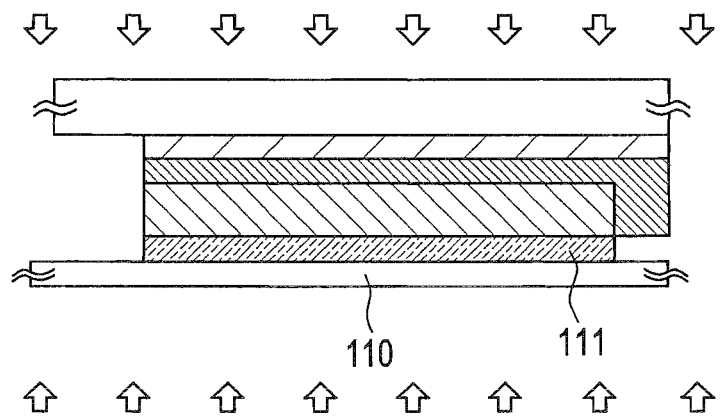
FIGS. 2F to 2I are drawings of explaining a peeling process of the present invention.
Figure 2G:
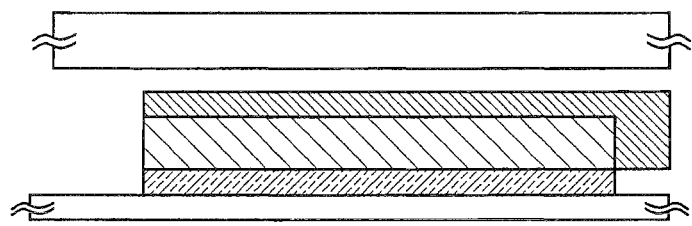
Figure 2H:
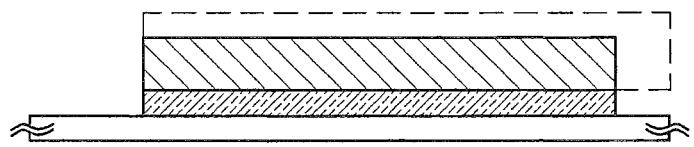
Figure 2I:
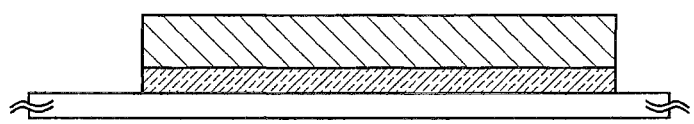
Figure 3A:
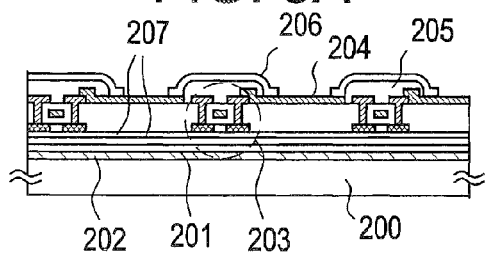
FIGS. 3A to 3I are drawings of manufacturing a light emitting device according to a peeling process of the present invention.

As shown in FIG. 3(A), a metal film 201 is formed on a first substrate 200. In the embodiment mode, a glass substrate with a film thickness of approximately 0.5 to 1.0 mm is utilized for the first substrate. As for the metal film, a monolayer or a lamination layer comprising an alloy material or a compound material of W, Ti, Ta, Mo, Nd, Ni, Co, Zr, Zn, Ru, Rh, Pd, Os and Ir or containing the element as its main component can be used. Sputtering may be used as a manufacturing method for the metal film on the first substrate using metal as a target. In addition, a film thickness of the metal film is 10 nm to 200 nm, preferably 50 nm to 75 nm.

When an alloy of the abovementioned metal (for example, an alloy of W and Mo: $W_xMo_{1-x}$) is used as the metal film, it may be formed by sputtering after disposing plural targets such as first metal (W) and second metal (Mo), or an alloy target of first metal (W) and second metal (Mo). In this way, setting appropriately the way of forming the metal film can control the process for peeling and widen the margin of the process. For example, when a metal alloy is used, controlling the composition ratio of each metal in the alloys can control the temperature of heat treatment and additionally, the necessity of heat treatment.

Afterwards, instead of a metal film, a nitrided metal film (metal nitride film) may be used In addition, nitrogen or oxygen may be added to the metal film. For example, ion implantation of nitrogen or oxygen to the metal film may be performed, or the metal film may be formed by sputtering in a film formation chamber which shall be a nitrogen or oxygen atmosphere. Furthermore, nitride metal may be used as a target.

Afterwards, a semiconductor film is formed through a base film 207 laminated over the metal film 201. In other words, an insulating film represented by a base film may be provided between the metal film and the semiconductor film in any number of layers of the insulating film. As the base film, a monolayer of an insulating film having silicon such as a silicon oxide film, a silicon nitride film or a silicon oxynitride film, or lamination of these may be used In the present embodiment mode, $SiO_2$ formed on the metal film with a thickness of 150 nm to 200 nm by sputtering, and SiON formed on the $SiO_2$ with a thickness of 80 to 100 nm by a CVD method are provided. The base film prevents impurity diffusion from a substrate or a metal film to a semiconductor film.

In addition, through the abovementioned process, an oxide film(a metal oxide film) 202 having the metal is formed on the surface of the metal film. The thickness of the metal oxide film may be 0.1 nm to 1 μm, preferably 0.1 nm to 100 nm, more preferably 0.1 nm to 5 nm. In addition, the oxidation film may be manufactured directly on the metal film.

Then, heat treatment is performed if necessary. By this heat treatment, the metal oxide film is crystallized, which causes a crystalline distortion or a lattice defect (a point defect, a line defect, a plane defect (for example, a plane defect due to a crystallographic shear plane which is formed by gathered oxygen vacancies) or an expansion defect). This is a state that the metal film is easily peeled.

Furthermore, by heating treatment, it is conceivable that a metal oxide having different crystal condition is formed by oxidation-reduction reaction due to diffusion of hydrogen contained in the semiconductor film. Therefore, it is a state that the metal film is easily peeled.

In addition, the abovementioned heat treatment can also serve as a heat treatment for crystallizing the semiconductor film. In other words, it is possible to form a crystalline semiconductor film and to crystallize a metal oxide film by heating a semiconductor film formed over a metal film.

After applying a metal element (represented by Ni element) which promotes crystallization, heat treatment may be performed, or a laser may be radiated after the heat treatment to improve crystallinity of the semiconductor film. In addition, in the case that a metal element promoting crystallinity is used, it is preferable to remove the metal element by a gettering process or an etching process since it is unnecessary for a device.

Afterwards, the crystalline semiconductor film is patterned to have a desired shape, and a gate insulating film is formed using an oxide film having silicon or a nitride film having silicon. A gate electrode is formed on the crystalline semiconductor film through the gate insulating film, and an impurity region is formed using the gate electrode as a mask. A laminated structure of W and TaN is used for the gate electrode, and source and drain regions, a low concentration impurity region (an LDD region), and a low concentration impurity region overlapped with the gate electrode (a GOLD region) may be provided. Thereby, a TFT 203 is formed.

Subsequently, an electrode 204 connected with either a source wiring or a drain wiring is formed. Then, an insulating film 205 having an organic material or an inorganic material is formed to cover the both ends of the electrode 204, that is, to cover the both ends of each adjacent electrode. Further, a protective film 206 is formed to prevent moisture or oxygen from intruding.

As above, a TFT is formed as a semiconductor element. It is obvious that a passive matrix type display device may be used even though an active matrix type display device forming a TFT in each pixel is described. In addition, either a top gate type TFT or a bottom gate type TFT can be used.

In addition, a semiconductor element in the peel-off layer may be a TFT having an amorphous semiconductor film, an organic TFT, a thin film diode, a photoelectric conversion element having a PIN junction of silicon, a silicon resistor element, a sensor element (typically a pressure-sensitive fingerprint sensor using polysilicon), or the like.

Afterwards, as shown in FIG.3 (B), a light emitting layer 210 and a cathode 211 are formed. As the light emitting layer, each RGB light emitting layer may be formed or a white light emitting layer may be formed to indicate multicolor by a color conversion layer such as a color filter. As the cathode, in the case of top emission, it may be formed with a material having light-transmitting properties, for example, with ITO, and in the case of bottom emission, it may be formed with a metal alloy film such as a magnesium-silver MgAg film. In addition, it is preferable to form continuously up to a light emitting layer, a cathode and the like without exposing to the atmosphere.

It is preferable to perform vacuum heating to degas before or after forming a light emitting layer containing an organic compound. In addition, the surface of the first electrode is preferably flat, and planarization may be conducted by chemically or mechanically polishing treatment (typically, a CMP technique or the like) since the light emitting layer 210 containing an organic compound is extremely thin.

Cleaning (brush cleaning or bellclean cleaning) or plasma cleaning for cleaning a foreign substance (dust or the like) can be performed before forming the light emitting layer to improve cleanliness on the surface of the electrode 204. The adhesive used for the transferring can be removed clearly.

Then, peeling is performed as described below. In addition, although the case that peeling is performed after forming a light emitting element (a light emitting layer and a cathode or an anode) is described, peeling may be performed after forming the electrode 204. That is, a practitioner can suitably determine the peeling timing.

Figure 3D:
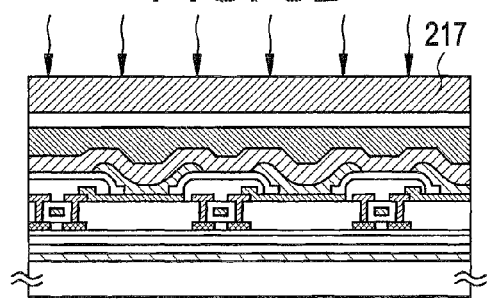
Figure 3B:
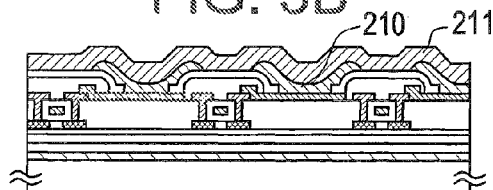
Figure 3E:
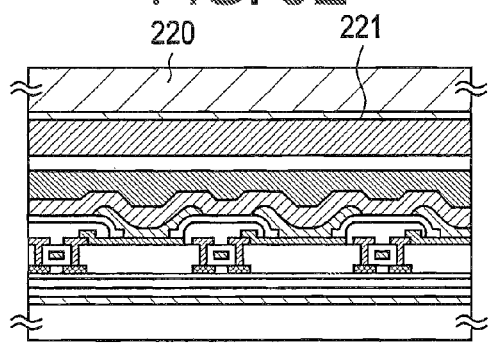
Figure 3C:
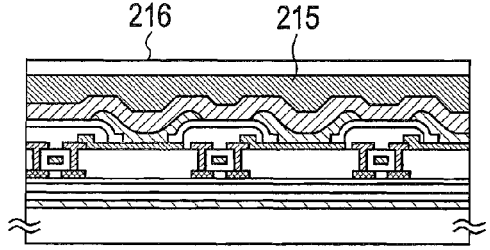

As shown in FIG. 3(C), a protective film 215 is formed on the cathode 215. As for the protective film, a film containing carbon or nitrogen such as DLC, CN or SiN can be formed.

An ultraviolet (UV) protective film 216 is formed on the protective film to protect the light emitting layer from being irradiated with an ultraviolet ray. In particular, in a light emitting device of top emission, an ultraviolet protective film (an UV film) is provided to prevent a light emitting layer from deteriorating because the light emitting layer is inevitably irradiated with an ultraviolet ray. In other words, as an UV protective film, a film (a sheet) having characteristics that transmits light from a light emitting layer, that is, a wavelength of approximately a visible light area (400 nm to 1 μm, preferably 450 nm to 800 nm) without transmitting a wavelength of an UV area may be used. For example, an organic resin film combined with an ultraviolet absorbent, specifically, a polyester film such as poly ethylene terephthalate or polyethylene-2,6-naphthalene dicarboxylate may be used. A polyester film may be formed by a known extrusion method or the like. In addition, an organic resin film having a structure in which a layer absorbing an ultraviolet ray and other layers are laminated may be used.

Then, as shown in FIG. 3(D), a water-soluble resin 217 is formed as a stress relaxation film by a spin coating method. The stress relaxation material may be cured by applying heat or being irradiated with an ultraviolet ray. In addition, in the case that a material cured by ultraviolet ray irradiation is used, a light emitting layer can be protected by an UV protective film when radiating an ultraviolet ray from above of the stress relaxation material.

Afterwards, it is preferable to separate or damage the peeling boundary face to easily conduct peeling. Although it is not illustrated, in the present embodiment mode, the first substrate, the peel-off layer and the water-soluble resin are divided by a scribe trigger which is a kind of a cutter to expose a cross-section of the peeling boundary face.

Then, as shown in FIG. 3(E), a second substrate 220 is provided over the water-soluble resin. In the present embodiment mode, a quartz substrate (thickness of 1.0 to 1.5 mm) which does not have adhesiveness is used for the second substrate, and fixed using a two-sided tape 221. A two-sided tape used in the peeling process has a feature of deterioration in adhesiveness or self-peeling by being irradiated with an ultraviolet ray, being heated, or being soaked in liquid such as water. In the present embodiment mode, a two-sided tape in which adhesiveness is weakened when it is irradiated with an ultraviolet ray is used.

An adhesive such as an ultraviolet curable resin, specifically an epoxy resin system adhesive, a thermosetting resin or a resin additive may be used instead of a two-sided tape. In addition, as an auxiliary substrate, a quartz substrate may be fixed under the first substrate using a two-sided tape, an adhesive or the like.

Figure 3F:
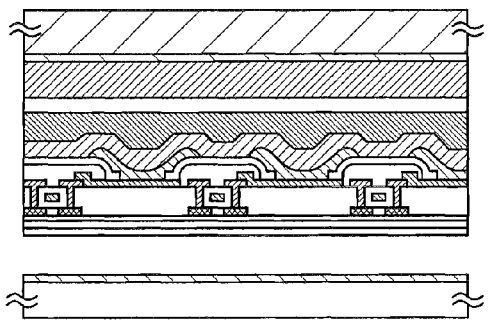

Then, as shown in FIG. 3(F), the first substrate and the peel-off layer having a semiconductor element are separated by a physical means. It is illustrated to separate at the boundary between the metal oxide film and the metal film. However, it is separated from the inside of the crystallized metal oxide film or from the boundaries of both sides of the metal oxide film, in other words, it is separated at the boundary between the metal oxide film and the metal film, between the boundary of the metal oxide film and the peel-off layer, or the like. In the case it is separated inside the metal oxide film, metal oxide is sometimes dotted and adhered to the lower surface of the peel-off layer. In addition, in the case of separating at the boundary between the metal oxide film and the metal film, or at the boundary between the metal oxide film and the peel-off layer, the metal oxide film sometimes exists only on the lower surface of the peel-off layer, or only on the upper surface of the metal film. When the metal oxide is dotted or adhered to the lower surface of the peel-off layer, metal oxide may be removed by etching or chemical or physical polishing, or remain adhered.

Figure 3G:
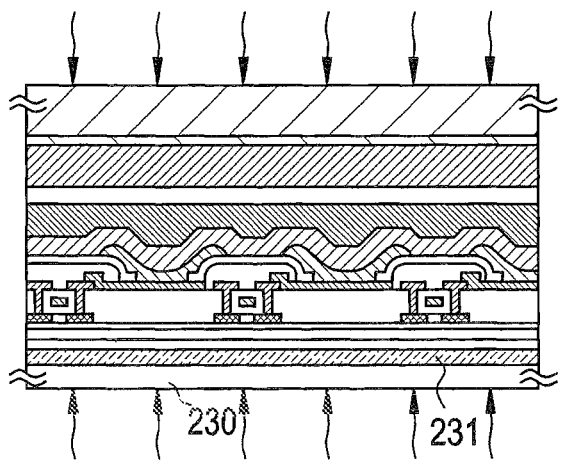

Then, as shown in FIG. 3(G), the peel-off layer is fixed to a film substrate 230 which is a third substrate. In the case that the film substrate does not have adhesiveness, the peel-off layer is secured through a second adhesive 231. As for the second adhesive, an ultraviolet curable resin, specifically, an adhesive such as an epoxy resin system adhesive, a thermosetting resin or a resin additive, or a two-sided tape may be used. In the present embodiment mode, as for the second adhesive, water insoluble adhesive which cures by ultraviolet ray irradiation is used. In other words, as the second adhesive, a material which is not peeled when the stress relaxation material is removed should be used considering the feature of the stress relaxation material. Naturally, the stress relaxation film is not necessarily removed.

In other words, in the present embodiment mode, adhesives in which a factor of adhesiveness deterioration of the first adhesive or peeling and a factor of curing of the second adhesive are the same are used. For example, when an adhesive in which adhesiveness is weakened by ultraviolet ray irradiation and an adhesive which is cured by ultraviolet ray irradiation are used, peeling of the second substrate and fixing to the third substrate can be done by one time of ultraviolet irradiation. Therefore, process can be simplified.

Figure 3H:
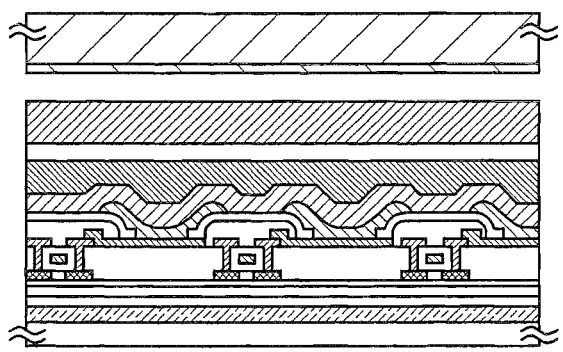

Then, as shown in FIG. 3(H), the second substrate is separated. It is separated easily and accurately since adhesiveness of the first adhesive has weakened.

Figure 3I:
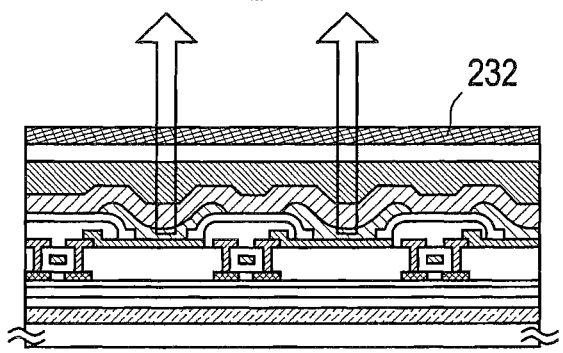

Subsequently, as shown in FIG. 3(I), the water-soluble resin is removed. In the present embodiment mode, the peel-off layer fixed to the third substrate is soaked into pure water to remove the water-soluble resin and only the water-soluble resin is removed. Afterwards, a sealing film 232 is formed on the UV protective film, and the peel-off layer is transferred to the third substrate. Thus, a top emission light emitting device is completed.

In addition, plasma cleaning or bellclean cleaning using an argon gas and an oxygen gas may be performed to remove the first and second adhesives and the stress relaxation material precisely.

As above, a light emitting device having a TFT or the like formed over the film substrate can be formed by a simplified peeling process. As a result, a light emitting device which is thin, light-weight, hard to damage in being dropped, and flexible can be provided.

Plural layers to be peeled provided with a TFT or the like according to each use of a light emitting device may be transferred to a film substrate. For example, a peel-off layer having a TFT for a pixel portion and a TFT for driving a circuit is formed, then, it may be transferred to a predetermined region of a film substrate.

In addition, in the present embodiment mode, although a case of a top emission light emitting device is described, the present invention can obviously be adopted to a bottom emission light emitting device.

Embodiment Mode 2

In the present embodiment mode, a peel-off layer is in a state in which up to a light emitting element and a liquid crystal element are formed. A case of performing peeling and transferring, that is, an example of manufacturing a bottom emission light emitting device by using a peeling process of controlling adhesiveness of an adhesive by adding an ultraviolet ray and heat is described. In addition, description of process or materials as in the embodiment mode 1 is omitted.

Figure 4A:
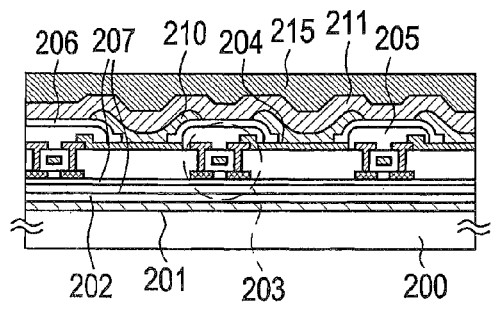
FIGS. 4A to 4E are drawings of manufacturing a light emitting device according to a peeling process of the present invention.

At first, to a protective film 215 are formed as the embodiment mode 1 (FIG. 4(A)). However, it is necessary to use a material having light-transmitting properties for a electrode 204 because it is a bottom emission light emitting device. In addition, although a stress relaxation material may be provided, it is not particularly provided in the present embodiment mode.

Figure 4B:
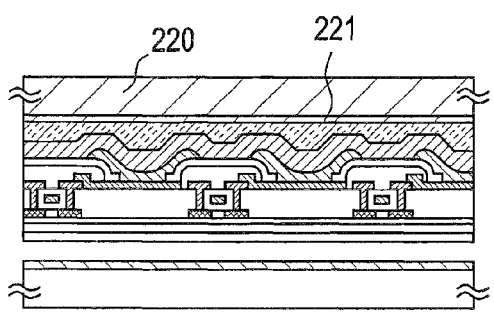

Next, as shown in FIG. 4(B), a second substrate 220 is fixed on the protective film 215 using a two-sided tape as an adhesive, then, the first substrate 200 is peeled.

Figure 4C:
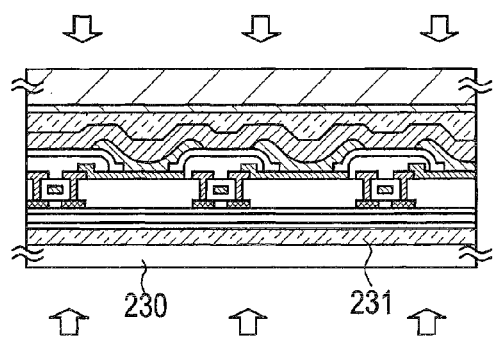

Next, as shown in FIG. 4(C), a film substrate 230 which is a third substrate is pasted by an adhesive 231 under the surface of the peel-off layer. In the present embodiment mode, an ultraviolet ray is radiated from the lower surface of the film substrate to heat because a two-sided tape in which adhesiveness is weakened or which is peeled by heating, and an adhesive which is cured by an ultraviolet ray are used. Naturally, an ultraviolet ray may be radiated from both sides of the substrate. In addition, when an ultraviolet ray is transmitted through an electrode, it may be emitted from above of the second substrate. Naturally, a two-sided tape in which adhesiveness is weakened or which is peeled by an ultraviolet ray, and an adhesive which is cured by heating may be used. In this case, it would be appropriate to radiate an ultraviolet ray from above of the second substrate.

As the present embodiment mode, by performing ultraviolet ray irradiation and heating, peeling and curing can be performed in the same step even if a factor of adhesiveness deterioration or peeling of the two-sided tape 221 and a factor of curing of the adhesive are different each other. Thereby, a peeling process can be shortened.

Figure 4D:
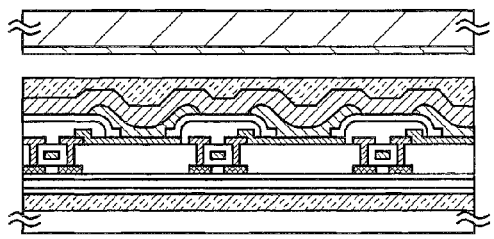
Figure 4E:
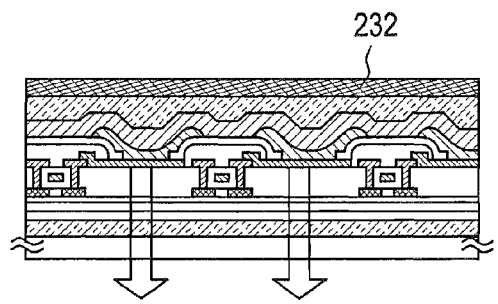

Afterwards, as shown in FIG. 4(D), the second substrate is peeled. Then, as shown in FIG. 4(E), a sealing film 232 is formed to complete a bottom emission light emitting device.

As above, it can be used as a light emitting device having a TFT or the like formed on the film substrate by a shortened peeling process. As a result, a light emitting device which is thin, light-weight, hard to damage in being dropped and flexible can be provided.

In addition, in the present embodiment mode, even though a bottom emission light emitting device is described, the present invention is obviously adoptable to a top emission light emitting device. In the case of top emission, an UV protective film may be provided to prevent a light emitting layer from deteriorating.

Embodiment Mode 3

In the present embodiment mode, a peel-off layer is in a state in which up to a semiconductor element, an electrode, an insulating film and the like are formed, and a method for manufacturing a light emitting device when peeling and transferring are performed is described.

Figure 12A:
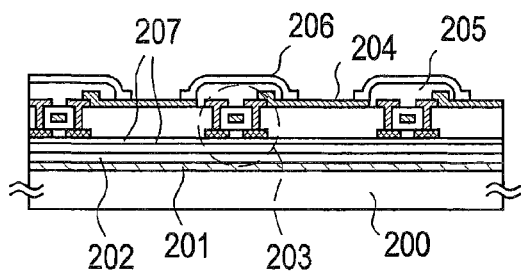
FIGS. 12A to 12I are drawings of manufacturing a light emitting device according to a peeling process of the present invention.

As shown in FIG. 12(A), a metal film 201 is formed on a first substrate 200. In the present embodiment mode, a glass substrate with a thickness of about 0.5 to 1.0 mm is utilized. As for the metal film, a monolayer or a lamination layer comprising an alloy material or a compound material of W, Ti, Ta, Mo, Nd, Ni, Co, Zr, Zn, Ru, Rh, Pd, Os and Ir or containing the element as its main component can be used. The metal film may be formed over the first substrate by sputtering using metal as a target. Note that the film thickness of the metal film shall be 10 nm to 200 nm, preferably be 50 nm to 75 nm.

When a metal alloy of the aforementioned metal (for example, an alloy of W and Mo: $W_xMo_{1-x}$) is used for the metal film, plural targets such as a first metal (W) and a second metal (Mo), or a target of an alloy of the first metal (W) and the second metal (Mo) is disposed in a film formation chamber; thereby the metal film may be formed by sputtering. By setting the formation of metal film appropriately as above, the peeling process can be controlled, and a range of process is broadened. For example, when a metal alloy is used, use or disuse of heat treatment and the temperature of heat treatment can be controlled by controlling the composition ratio in each metal of the alloy.

Instead of the metal film, a nitrided metal film (metal nitride film) may be used. Nitrogen and oxygen may be further added to the metal film. For example, ion implantation of nitrogen or oxygen to a metal film may be performed, or a metal film may be formed by sputtering in a film formation chamber which shall be a nitrogen or oxygen atmosphere. Furthermore, metal nitride may be used as a target.

Afterwards, a semiconductor film is formed through a base film 207 laminated on the metal film 201. In other words, an insulating film represented by the base film may be provided between the metal film and the semiconductor film in any number of layers of the insulating film. As the base film, a single layer of an insulating film having silicon such as an oxidation silicon film, a silicon nitride film, or a silicon oxynitride film or a lamination film thereof may be used. In the present embodiment, $SiO_2$ with a thickness of 150 nm to 200 nm formed on the metal film by sputtering and SiON with a thickness of 80 to 100 nm formed on the $SiO_2$ by a CVD method are provided. Impurity diffusion from a substrate or a metal film to a semiconductor film can be prevented by the base film.

In addition, an oxide film (a metal oxide film) 202 having the metal is formed on the surface of the metal film after the aforementioned process. The metal oxide film may be formed to have a film thickness of 0.1 nm to 1 μm, preferably 0.1 nm to 100 nm, more preferably 0.1 nm to 5 nm. In addition, the oxide film may be formed directly on the metal film.

Then, heat treatment is performed if necessary. By this heat treatment, the metal oxide film crystallizes, which causes a crystalline distortion or a lattice defect (a point defect, a line defect, a plane defect (for example, a plane defect due to a crystallographic shear side which is formed by gathered oxygen vacancies), an expansion defect). This is a state that the metal oxide film is easily peeled.

Furthermore, by heating treatment, it is conceivable that metal oxide different in crystal condition is formed by oxidation-reduction reaction due to diffusion of hydrogen contained in the semiconductor film. Therefore, it is a state that the metal film is easily peeled.

In addition, the abovementioned heat treatment can be combined with heat treatment for crystallizing the semiconductor film. In other words, it is possible to form a crystalline semiconductor film and to crystallize a metal oxide film by heating a semiconductor film formed on a metal film.

After applying a metal element (represented by Ni element) which promotes crystallization, heat treatment may be performed or a laser may be radiated after heat treatment to improve crystallinity of the semiconductor film. In addition, in case that a metal element promoting crystallization is used, it is preferable to remove the metal element by a gettering process or an etching process because it is unnecessary for a device.

Afterwards, the crystalline semiconductor film is patterned to have a desired shape, and a gate insulating film is formed using an oxidation film having silicon or a nitride film having silicon. A gate electrode is formed on the crystalline semiconductor film through the gate insulating film, and an impurity region is formed by using the gate electrode as a mask. A lamination structure of W and TaN is used for the gate electrode, and source and drain regions, a low concentration impurity region (an LDD region) and a low concentration impurity region overlapping with the gate electrode (a GOLD region) may be provided. Thereby, a TFT 203 is formed.

Subsequently, an electrode 204 connected with either a source wiring or a drain wiring is formed. Then, an insulating film 205 having an organic material or an inorganic material is formed to cover the both ends of the electrode 204, that is, to cover the both ends of each adjacent electrode. As the insulating film, aside from an acrylic film (including photosensitive acrylic), an organic material such as polyimide, polyamide or BSB (benzocyclobutene), or aside from a silicon oxide film, an inorganic material containing silicon such as a silicon nitride film, a silicon nitride oxide film or a coated silicon oxide film (SOG: Spin On Glass) may be used. In the present embodiment mode, photosensitive acrylic is used After forming the insulating film, an opening is formed by etching to expose the electrode 204. Then, a protective film 206 is formed on the insulating film since an insulating film, particularly an insulating film having an organic material is easily intruded by moisture, oxygen or the like which will cause deterioration of a light emitting element. A film containing carbon or nitrogen such as DLC, CN or SIN may be formed as a protective film.

As above, a TFT is formed as a semiconductor element. It is obvious that a passive matrix type may be accepted even though an active matrix type display device forming a TFT in each pixel is described.

In addition, a semiconductor element of the peel-off layer may be an organic TFT, a thin film diode, a photoelectric conversion element comprising a PIN junction of silicon, a silicon resistor element, a sensor element (typically a pressure-sensitive fingerprint sensor) or the like.

Figure 12B:
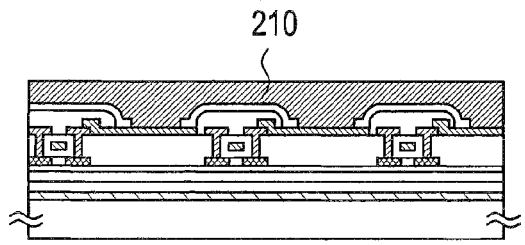

Then, peeling is performed as described below. In addition, although the case that peeling is performed after forming an electrode, an insulating film and the like is described, peeling can be performed after forming a light emitting layer. That is, a practitioner can suitably determine the peeling timing. Then, as shown in FIG. 12(B), a water-soluble resin 210 is formed as a stress relaxation material so as to cover the electrode, the insulating film and the protective film by a spin coating method. The stress relaxation material may be cured by applying heat or being irradiated with an ultraviolet ray. In addition, in the case of using a material which is cured by being irradiated with an ultraviolet ray, a semiconductor element can be protected by an ultraviolet ray protective film (an UV protective film) when deterioration of the semiconductor element is concerned.

As the UV protective film, a film (or a sheet) having a feature that transmits light from a light emitting layer that is, a wavelength of a visible light area (400 nm to 1 µm, preferably 150 nm to 800 nm) without transmitting a wavelength of an ultraviolet ray area (an UV region) (does not transmit at least 90% or more) may be used. For example, an organic resin film combined with an ultraviolet absorbent, specifically, a polyester film such as poly ethylene terephthalate, polyethylene-2,6-naphthalene dicarboxylate or the like may be used. A film of polyester may be formed by a known extrusion method or the like. In addition, an organic resin film having a structure in which a layer absorbing an ultraviolet ray and other layer are laminated may be used.

Afterwards, it is preferable to divide or damage the peeling boundary to conduct peeling easily. Although it is not illustrated, in the present embodiment mode, the first substrate, the peel-off layer and the water-soluble resin are divided by a scribe trigger which is a kind of a cutter to expose a section of the peeling boundary.

Figure 12C:
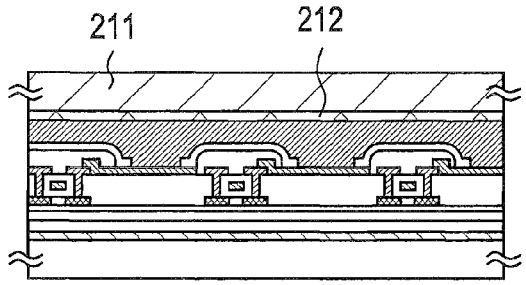

Then, as shown in FIG. 12(C), a second substrate 211 is provided on the water-soluble resin. In the present embodiment mode, a quartz substrate (thickness 1.0 to 1.5 mm) which does not have adhesiveness is used for the second substrate, and fixed using a two-sided tape 212. A two-sided tape used in peeling process has features of deterioration in adhesiveness or self-peeling by being irradiated with an ultraviolet ray, heating or being soaked in liquid such as water. In the present embodiment mode, a two-sided tape in which adhesiveness is weakened at the time of being irradiated with an ultraviolet ray is used.

An adhesive such as an ultraviolet curable resin, specifically an epoxy resin system adhesive, a thermosetting resin or a resin additive may be used. In addition, the quartz substrate as an auxiliary substrate may be fixed under the first substrate with a two-sided tape, an adhesive or the like.

Figure 12D:
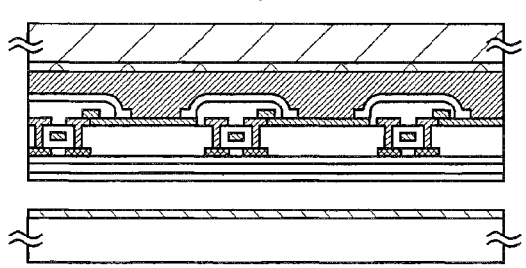

Then, as shown in FIG. 12(D), the first substrate and the peel-off layer having a first electrode and a semiconductor element are separated by a physical means. It is illustrated to peel at the boundary between the metal oxide film and the metal film. However, it is separated from the inside of the crystallized metal oxide film or from the boundaries of both sides of the metal oxide film, in other words, it is separated at the boundary between the metal oxide film and the metal film, at the boundary between the metal oxide film and the peel-off layer or the like. In the case that it is separated inside the metal oxide film, metal oxide sometimes dotted and adhered to the lower surface of the peel-off layer. In addition, in the case of separating at the boundary between the metal oxide film and the metal film, or at the boundary between the metal oxide film and the peel-off layer, the oxide metal film sometimes exists only on the lower surface of the peel-off layer or only on the upper surface of the metal film. When the metal oxide is dotted or adhered to the lower surface of the peel-off layer, metal oxide may be removed by etching, or chemical or physical polishing, or remain adhered.

Figure 12E:
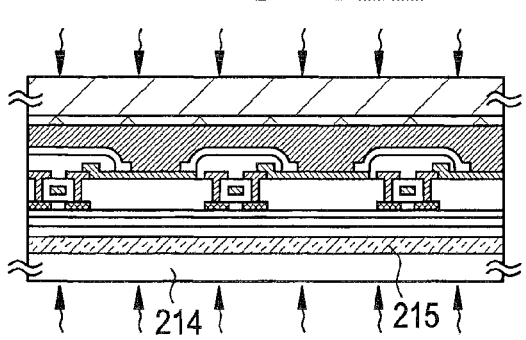

Then, as shown in FIG. 12(E), the peel-off layer is secured to a film substrate 214 which is a third substrate. In the case that the film substrate does not have adhesiveness, the peel-off layer is secured through a second adhesive 215. As for the second adhesive, an ultraviolet curable resin, specifically, an adhesive such as an epoxy resin system adhesive, a thermosetting resin, a resin additive or the like, or a two-sided tape may be used.

In the present embodiment mode, as for the second adhesive, water insoluble adhesive which is cured by ultraviolet ray irradiation is used. In other words, as the second adhesive, a material which is not peeled should be used when the stress relaxation material is removed considering the feature of the stress relaxation material. Naturally, the stress relaxation film is not necessarily removed.

In other words, in the present embodiment mode, adhesives in which a factor of adhesiveness deterioration of the first adhesive or peeling and a factor of curing of the second adhesive are the same are used. For example, when an adhesive in which adhesiveness is weakened by ultraviolet ray irradiation and an adhesive which is cured by ultraviolet ray irradiation are used, peeling of the second substrate and fixing to the third substrate can be done by one time of ultraviolet irradiation. Therefore, the process can be simplified.

Figure 12F:
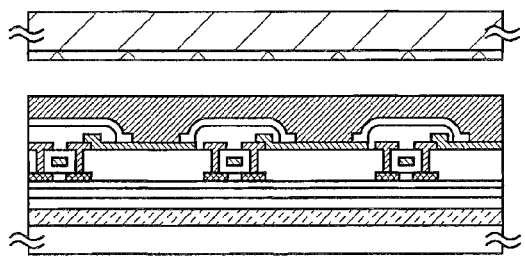
Figure 12G:
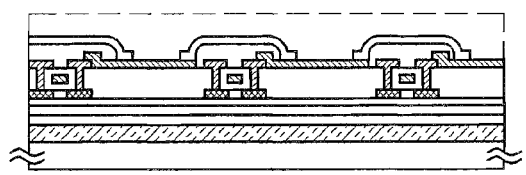

Then, as shown in FIG. 12(F), the second substrate is peeled. It is peeled easily and accurately since adhesiveness of the first adhesive has weakened.

Figure 12H:
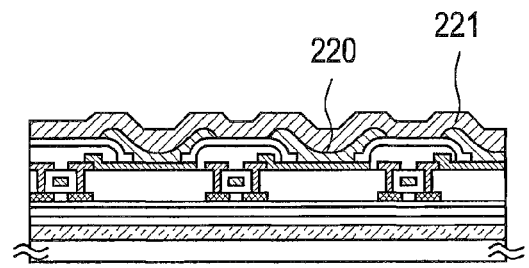

Subsequently, as shown in FIG. 12(H), the water-soluble resin is removed. In the present embodiment mode, the peel-off layer fixed to the third substrate is soaked into pure water to remove the water-soluble resin and only the water-soluble resin is removed.

In addition, plasma cleaning or bellclean cleaning using an argon gas and an oxygen gas may be performed to remove the first and second adhesives and the stress relaxation material precisely.

Figure 12I:
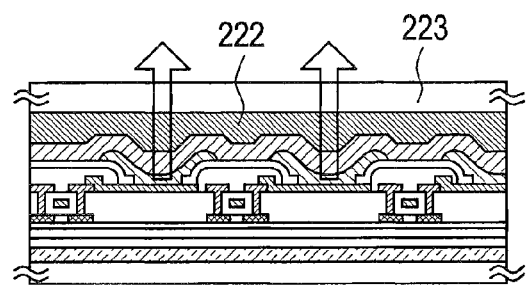

Afterwards, as shown in FIG. 12(I), a light emitting layer 220 and a cathode 221 are formed on a protective film. At this time, an extra supporting substrate may be prepared to reduce instability of the film substrate, and the light emitting layer or the cathode may be evaporated with a state in which it is fixed to the supporting substrate. In the present embodiment mode, a light emitting layer is formed by a vacuum evaporation.

As for the light emitting layer, each RGB light emitting layer may be formed, or a white light emitting layer is formed and multicolor may be indicated by a color conversion layer such as a color filter. In the case of top emission, a cathode may be formed of a material having light-transmitting properties, for example, of ITO and in the case of bottom emission, it may be formed of a metal alloy film such as a magnesium-silver MgAg film.

Before or after forming a light emitting layer containing an organic compound, it is preferable to perform vacuum heating to degas. In addition, because the light emitting layer 210 containing an organic compound is extremely thin, it is preferable that the surface of the first electrode is flat. It may be planarized by treatment polishing chemically or mechanically (typically by a CMP technology or the like).

Cleaning (brush cleaning or bellclean cleaning) or plasma cleaning to clean a foreign substance (dust or the like) can be performed before forming the light emitting layer to improve cleanliness on the surface of the electrode 204. The adhesive used for the transferring can be also removed completely.

Then, as shown in FIG. 12(J), a protective film 222 is formed on the cathode and a sealing film 223 is fanned. In addition, when space is formed between the sealing film and the cathode, nitrogen purge may be performed then a desiccating agent or the like may be sealed to prevent deterioration of a light emitting layer or the like. In addition, it is preferable to sequentially fowl to the light emitting layer, the cathode and the protective film without exposing to atmosphere.

Thus, the peel-off layer is transferred to the film substrate to complete a top emission light emitting device. As a result, a light emitting device which is thin, light-weight, hard to damage in being dropped and flexible can be provided.

In addition, plural layers to be peeled provided with a TFT or the like according to each use of a light emitting device may be transferred. For example, a peel-off layer having a TFT for a pixel portion and a TFT for driving circuit is formed, then, it may be transferred to a predetermined region of the film substrate.

In addition, in the present embodiment mode, although the case of a top emission light emitting device is described, the present invention is obviously adoptable to a bottom emission light emitting device.

Embodiment Mode 4

In the present embodiment mode, a peel-off layer is in a state in which up to a semiconductor element, an electrode, an insulating film and the like are formed, and a case of performing peeling and transferring, and an example of manufacturing a bottom emission light emitting device by using a peeling process of controlling adhesiveness of an adhesive by adding an ultraviolet ray and heat are described. In addition, description of the process or materials as in the embodiment mode is omitted.

At first, up to a protective film 206 are formed as the embodiment mode 1 (FIG. 13(A)). However, it is necessary to use a material having light-transmitting properties for an electrode 204 since it is a bottom emission light emitting device. In addition, although a stress relaxation material may be provided, it is not particularly provided in the present embodiment mode.

Next, as shown in FIG. 13(B), a second substrate 211 is fixed on the protective film 206 using a two-sided tape 212 as an adhesive, then, a first substrate 200 is peeled. Then, as shown in FIG. 13(C), a film substrate 214 which is a third substrate is pasted under the surface of the peel-off layer by an adhesive 215. In the present embodiment mode, an ultraviolet ray is radiated from the lower surface of the film substrate to heat because a two-sided tape in which adhesiveness is weakened or which is peeled by heating, and an adhesive which is cured by an ultraviolet ray are used. Naturally, an ultraviolet ray may be radiated from both sides of the substrate. In addition, when an ultraviolet ray transmits through an electrode, it may be radiated form above of the second substrate. Naturally, a two-sided tape in which adhesiveness is weakened or which is peeled by an ultraviolet ray, and an adhesive which is cured by heating may be used In this case, it would be appropriate to radiate an ultraviolet ray from above of the second substrate.

As the present embodiment mode, peeling and curing can be performed in the same step by performing ultraviolet ray irradiation and heating even if a factor of adhesiveness deterioration or peeling of the two-sided tape 221 and a factor of curing of the adhesive are different from each other. Thereby, a peeling process can be simplified.

Afterwards, as shown in FIG. 13(D), the second substrate is peeled. Then, as shown in FIG. 13(E), a light emitting layer 220 and a cathode 211 are formed. Then, a protective film 222 is formed on the cathode and a sealing film 223 is provided to complete a bottom emission light emitting device.

As above, it can be used as a light emitting device having a TFT or the like formed on the film substrate by a shortened peeling process. As a result, a light emitting device which is thin, light-weight, hard to damage in being dropped and flexible can be provided.

In addition, in the present embodiment mode, even though a bottom emission light emitting device is described, the present invention is obviously adoptable to top emission light emitting device. An UV protective film may be provided when deterioration of a semiconductor element is concerned by ultraviolet ray irradiation.

Embodiment Mode 5

In the present embodiment mode, a peel-off layer is in a state in which up to a light emitting element and a liquid crystal element are formed, and a case of performing peeling and transferring, and a case of manufacturing a liquid crystal display device by using a peeling process of controlling adhesiveness of an adhesive by heating are described.

Figure 5A:
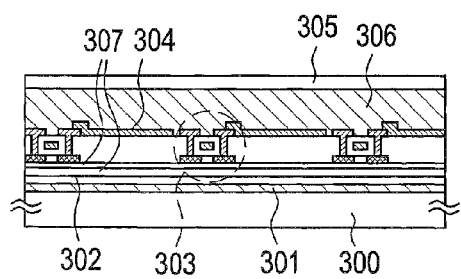
FIGS. 5A to 5F are drawings of manufacturing a liquid crystal display device according to a peeling process of the present invention.

As shown in FIG. 5(A), a metal film 301 is formed on a fast substrate 300. As for the first substrate and the metal film, material described in the embodiment mode 1 may be used. In the present embodiment mode, an alloy film of Mo and W is formed on a glass substrate. At this time, plural targets such as a first metal (W) and a second metal (Mo), or a target of an alloy of the first metal (W) and the second metal (Mo) is disposed in a film formation chamber, thereby the metal film may be formed by sputtering. By setting the composition of metal film appropriately as above, the peeling process can be controlled, and a range of process is broadened.

Afterwards, a TFT 303 is formed through base films 307 as the embodiment mode 1, and an electrode 304 connected to one of wirings of the TFT is formed.

In addition, by the time the semiconductor film or the base film is formed, a metal oxide film 302 which is an oxide containing the metal is formed on the metal film. Then a counter substrate 305 provided with a color filter or the like is arranged to form a liquid crystal 306 between the first substrate and the counter substrate. A film substrate may be used as the counter substrate. The liquid crystal may be injected by a vacuum injection method or by dropping in the vacuum atmosphere. As a liquid crystal material, a known material, for example, a dispersed liquid crystal, a ferroelectric liquid crystal, an antiferroelectric liquid crystal, or the like may be used. As for a liquid crystal with high viscosity such as a dispersed liquid crystal, it would be appropriate to use a dropping method.

In addition, when manufacturing a liquid crystal display device, although a spacer is formed or sprayed to keep the flexible substrates apart, three times spacer than usual may be formed or sprayed. In addition, a spacer may be manufactured softer than the case of being used to a usual glass substrate. Moreover, a spacer need to be fixed not so as to move since the film substrate is flexible.

Furthermore, when a film substrate used as a counter substrate or a third substrate transmits moisture or impurity, it may be covered with an organic material such as polyvinyl alcohol, ethylene-vinylalcohol copolymer, or an inorganic material such as polysilazane, aluminum oxide, silicon oxide silicon nitride, or a barrier film formed of lamination of these.

Figure 5D:
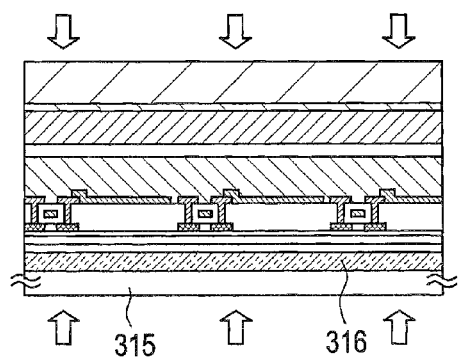
Figure 5B:
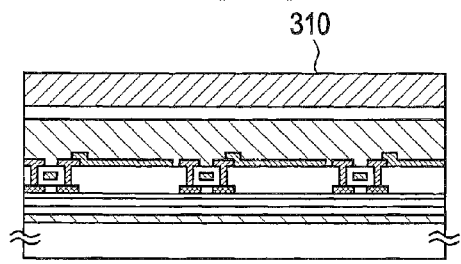

Afterwards, as shown in FIG. 5(B), a water-soluble resin 310 is formed as a stress relaxation material by spin coating.

Figure 5E:
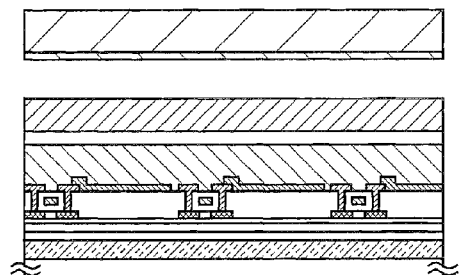
Figure 5C:
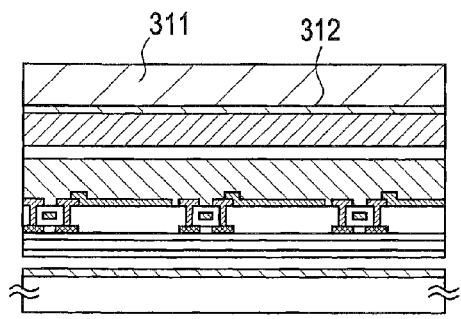

Next, as shown in FIG. 5(C), a second substrate 311 is fixed on the water-soluble resin by a two-sided tape 312. Then, the first substrate is separated by a physical means such as a tape. At this time, it is separated from the inside the crystallized metal oxide film or from the boundaries of both sides of the metal oxide film, in other words, it is separated at the boundary between the metal oxide film and the metal film or at the boundary between the metal oxide film and the peel-off layer. In the case that it is separated inside the metal oxide film, metal oxide sometimes dotted and adhered to the lower surface of the peel-off layer. In this case, metal oxide may be removed by etching or polishing or adhered.

Then, as shown in FIG. 5(D), a film substrate 315 corresponding to a third substrate is pasted. In the present embodiment mode, an adhesive 316 which is cured by heating is used to fix the film substrate. At this time, curing of the adhesive and peeling of the two-sided tape can be performed at the same time by the present process because the two-sided tape 312 in which adhesiveness is weakened or which is peeled by itself by heating is used. As a result, a manufacturing process can be shortened.

The abovementioned process may also be performed by radiating an ultraviolet ray. In that case, a two-sided tape which is peeled by ultraviolet ray irradiation and an adhesive which is cured by ultraviolet ray irradiation may be used.

Then, as shown in FIG. 5(E), the second substrate is peeled. It can be peeled easily and uniformly since adhesiveness has weakened.

Figure 5F:
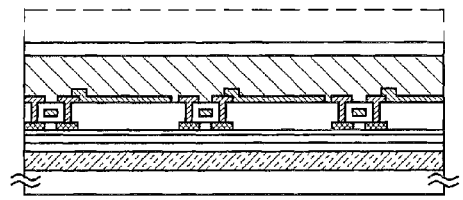

Then, as shown in FIG. 5(F), the water-soluble resin is removed by soaking it in purified water. Afterwards, a liquid crystal display device having a TFT formed on the film substrate is completed by providing a polarizing plate or the like suitably.

As above, a liquid crystal display device having a TFT or the like formed on a film substrate can be formed by the simplified manufacturing process. As a result, a liquid crystal display device which is thin, light-weight, hard to damage in being dropped and flexible can be provided.

Embodiment Mode 6

In the present embodiment mode, a peel-off layer is in a state in which up to a light emitting element and a liquid crystal element are formed, and a case of performing peeling and transferring, and an example of manufacturing a liquid crystal display device by using a peeling process of controlling adhesiveness by radiating an ultraviolet ray in addition to heating are described. In addition, description of the same process or materials as in the embodiment mode 5 is omitted.

Figure 6A:
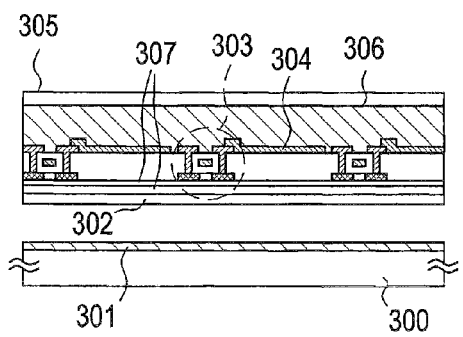
FIGS. 6A to 6D are drawings of manufacturing a liquid crystal display device according to a peeling process of the present invention.

At first, a metal film 301, a metal oxide film 302, a base film 307, a TFT 303, an electrode 304, a counter substrate 305 and a liquid crystal 306 are formed over a first substrate 300 as in the embodiment mode 3. (FIG. 6(A)).

Figure 6C:
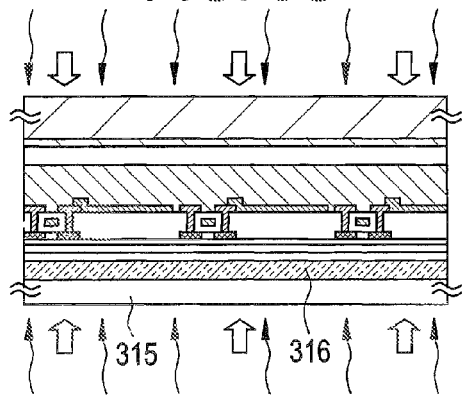
Figure 6B:
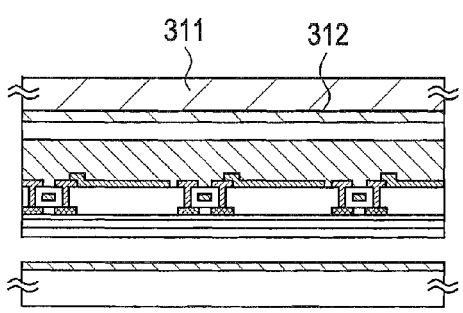

Then, as shown in FIG. 6(B), a second substrate 311 is pasted on the counter substrate by a two-sided tape 311. Afterwards, the first substrate is peeled by a physical means. In addition, although a stress relaxation material may be provided, it is not particularly provided in the present embodiment mode.

Next, as shown in FIG. 6(C), a film substrate 315 is pasted as a third substrate by an adhesive 316. In the present embodiment mode, the adhesive is cured by being irradiated with an ultraviolet ray from both sides of the substrate while heating the entire substrate. At the same time, adhesiveness of the two-sided tape 312 had weakened or peeled by itself by heating or ultraviolet ray irradiation. That is, a feature is that the two-sided tape to fix the second substrate is peeled and the adhesive for fixing the film substrate is cured by this step. Moreover, the two-sided tape may be either one which is peeled by heating or the other one which is peeled by ultraviolet ray irradiation since the heating and the ultraviolet ray irradiation are performed simultaneously. Thereby, a manufacturing margin can be widened.

Figure 6D:
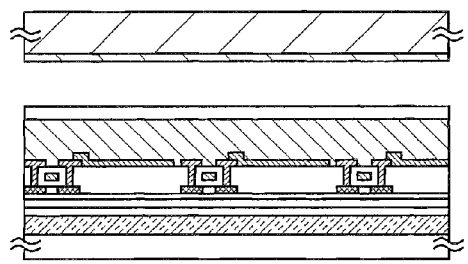

Afterwards, as shown in FIG. 6(D), a liquid crystal display device is completed by peeling the second substrate. As above, a liquid crystal display device having a TFT or the like formed on the film substrate can be formed by the simplified manufacturing process. As a result, a liquid crystal display device which is thin, light-weight, hard to damage in being dropped and flexible can be provided.

Embodiment Mode 7

In the present embodiment mode, a peeling layer is in a state in which up to a light emitting element and a liquid crystal element are formed, and a case of performing peeling and transferring, and a case forming a liquid crystal display device by using a peeling process of controlling adhesiveness of an adhesive by heating are described.

Figure 14A:
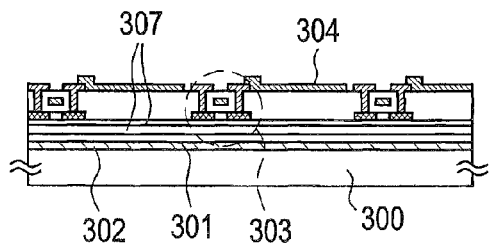
FIGS. 14A to 14G are drawings of manufacturing a liquid crystal display device according to a peeling process of the present invention.

As shown in FIG. 14(A), a metal film 301 is formed on a first substrate 300. As for the first substrate or the metal film, a material described in the Embodiment Mode 1 may be used. In the present embodiment mode, an alloy film of Mo and W is formed on a glass substrate. At this time, plural targets such as a first metal (W) and a second metal (Mo), or a target of an alloy of the first metal (W) and the second metal (Mo) is disposed in a film formation chamber, thereby the metal film may be formed by sputtering. By setting composition of a metal film appropriately like this, the peeling process can be controlled, and a process margin is widened. Afterwards, a TFT 303 is formed as in the Embodiment Mode 1, and an electrode 304 connected to one of wirings of the TFT is formed.

In addition, after a semiconductor film or a base film 307 are formed, a metal oxide film 302 which is an oxide of the metal is formed on the metal film.

Figure 14B:
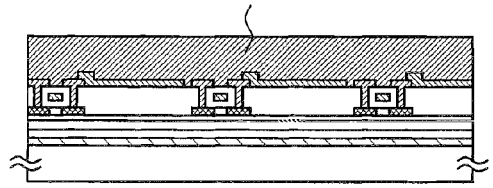

Then, as shown in FIG. 14(B), a water-soluble resin 310 is formed as a stress relaxation material by a spin coating method.

Figure 14C:
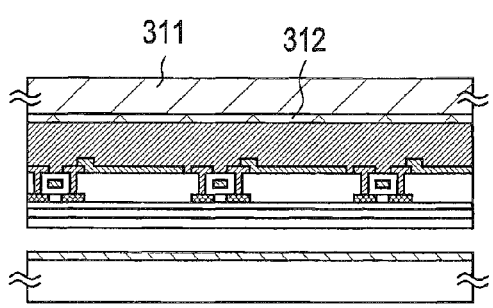

Next, as shown in FIG. 14(C), a second substrate 311 is fixed on the water-soluble resin by using a two-sided tape 312 as an adhesive. Afterwards, the first substrate is peeled by a physical means. At this time, it is separated from the inside the crystallized metal oxide film or from the boundaries of both sides of the metal oxide film, in other words, it is separated at the boundary between the metal oxide film and the metal film, at the boundary between the metal oxide film and the peel-off layer. In the case it is separated inside the metal oxide film, metal oxide sometimes dotted and adhered to the lower surface of the peel-off layer. In this case, the metal oxide may be removed by etching or polishing or remain adhered.

Figure 14D:
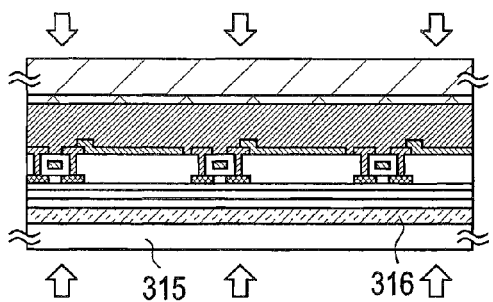

Then, as shown in FIG. 14(D), a film substrate 315 corresponding to a third substrate is pasted. In the present embodiment mode, an adhesive 316 which is cured by heating is used to fix the film substrate. At this time, curing of the adhesive and peeling of the two-sided tape can be performed at the same time by the present process because the two-sided tape 312 in which adhesiveness is weakened or which is peeled by itself by heating is used As a result, a manufacturing process can be simplified.

The abovementioned process may also be performed by radiating an ultraviolet ray. In that case, a two-sided tape which is peeled by being irradiated with an ultraviolet ray and an adhesive which is cured by being irradiated with an ultraviolet ray may be used.

Figure 14E:
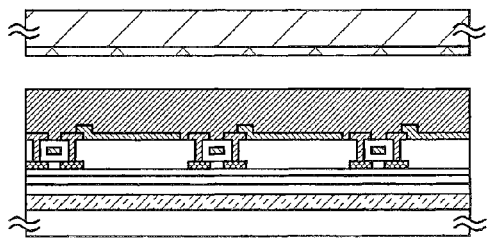
Figure 14F:
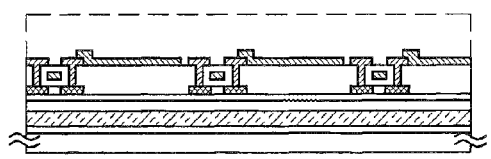

Then, as shown in FIG. 14(E), the second substrate is peeled. It can be peeled easily and uniformly since adhesiveness of the two-sided tape has weakened. Then, as shown in FIG. 14(F), the water-soluble resin is removed by soaking it in purified water.

Figure 14G:
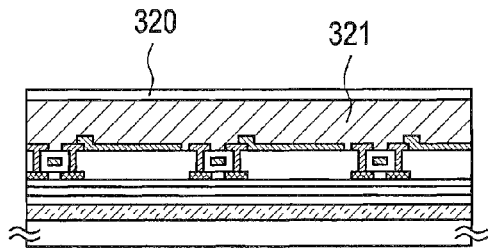

Then, as shown in FIG. 14(G), a counter substrate 305 provided with a color filter or the like is arranged to form a liquid crystal 306 between the first substrate and the counter substrate. In addition, although it is not illustrated, a polarizing plate is provided appropriately. A film substrate may be used as the counter substrate. The liquid crystal may be injected by a vacuum injection method or by dropping in the vacuum atmosphere. As a liquid crystal material, a known material, for example, a dispersed liquid crystal, a ferroelectric liquid crystal, an antiferroelectric liquid crystal or the like may be used. As for a liquid crystal with high viscosity to some extent like a dispersed liquid crystal, it would be appropriate to use a dropping method.

In addition, when manufacturing a liquid crystal display device, although a spacer is formed or sprayed to keep the substrates apart, about three times spacer than usual may be formed or sprayed to keep the interval of flexible substrate apart. In addition, a spacer may be manufactured to be softer than in the case of being used for a usual glass substrate. Moreover, a spacer need to be fixed not so as to move since the film substrate is flexible.

Furthermore, when a film substrate used as a counter substrate or a third substrate transmits moisture or an impurity, it may be covered with an organic material such as polyvinyl alcohol, ethylene-vinylalcohol copolymer or the like or an inorganic material such as polysilazane, aluminum oxide, silicon oxide, silicon nitride or the like or a barrier film formed of lamination of these.

As above, a light emitting device having a TFT or the like formed on the film substrate can be manufactured by a simplified peeling process. As a result, a light emitting device which is thin, light-weight, hard to damage in being dropped and flexible can be provided.

Embodiment Mode 8

In this present embodiment mode, a peel-off layer is in a state in which up to a light emitting element and a liquid crystal element are formed, and an example of manufacturing a liquid crystal display device when using a peeling process of controlling adhesiveness by radiating an ultraviolet ray in addition to heating is described. In addition, description of the same process or materials as in the embodiment mode 7 is omitted.

Figure 15A:
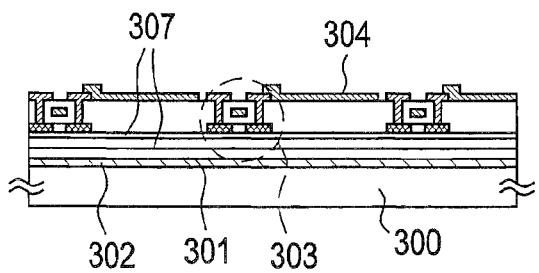
FIGS. 15A to 15E are drawings of manufacturing a liquid crystal display device according to a peeling process of the present invention.

At first, a metal film 301, a metal oxide film 302, a base film 307, a TFT 303 and an electrode 304 are formed over a first substrate 300 as in the embodiment mode 3 (FIG. 15(A)).

Figure 15B:
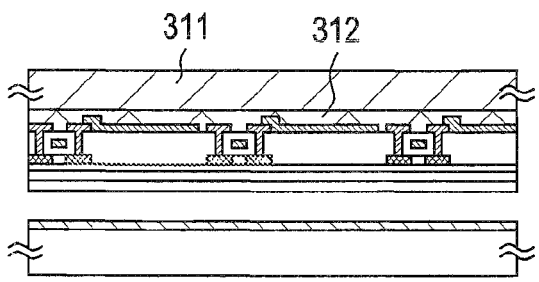

Then as shown in FIG. 15(B), a second substrate 311 is pasted on the electrode by a two-sided tape 312 as an adhesive. Afterwards, the first substrate is peeled by a physical means. In addition, although a stress relaxation material may be provided, it is not particularly provided in the present embodiment mode.

Figure 15C:
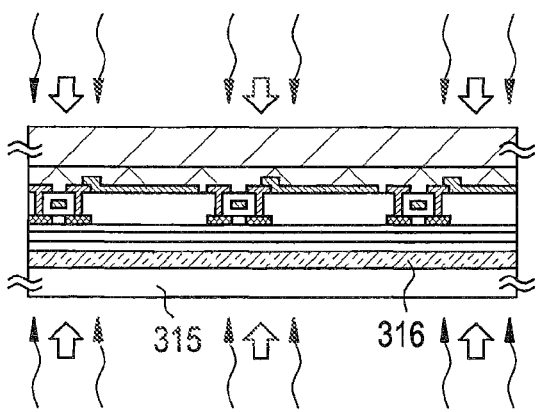

Next, as shown in FIG. 15(C), a film substrate 315 is pasted by an adhesive 316 as a third substrate. In the present embodiment mode, ultraviolet rays are radiated from both sides to cure the adhesive while heating the entire substrate. At the same time, adhesiveness of the two-sided tape 312 is weakened or peeled by itself by heating or ultraviolet ray irradiation.

That is, a feature is that the two-sided tape for fixing the second substrate is peeled and the adhesive for fixing the film substrate is cured according to the present process. Moreover, the two-sided may be either one which is peeled by heating or the other one which is peeled by ultraviolet ray irradiation since the heating and the ultraviolet ray irradiation are performed simultaneously. Thereby, a manufacturing margin can be widened.

Figure 15D:
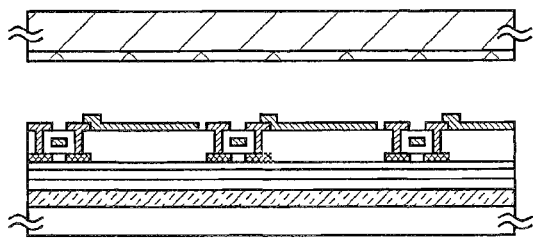
Figure 15E:
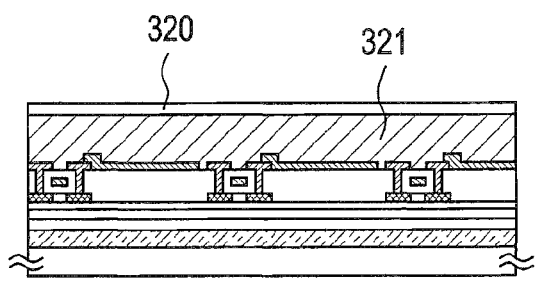

Afterwards, as shown in FIG. 15(D), the second substrate is peeled by a physical means. Then, as shown in FIG. 15(E), a counter substrate 320 provided with a color filter or the like is formed to form a liquid crystal 321.

As above, a liquid crystal display device having a TFT and the like formed on the film substrate can be manufactured by the simplified manufacturing process. As a result, a liquid crystal display device which is thin, light-weight, hard to damage in being dropped and flexible can be provided.

Embodiment Mode 9

In this present embodiment mode, a method of gang printing to form a display device having plural semiconductor elements from a large-size substrate (for example, 600×720 mm substrate) is described.

Figure 7A:
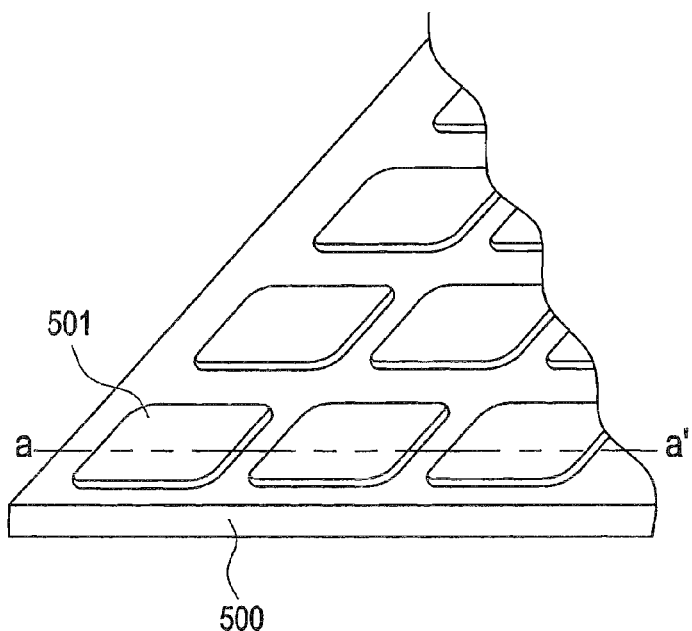
FIGS. 7A and 7B are drawings of explaining a gang printing using peeling process of the present invention.

FIG. 7(A) shows a state in which plural display devices or semiconductor element groups 501 are formed through an insulating film 510 of a base film or the like on the first substrate 500. The display device includes a light emitting device, a liquid crystal display device and other types of display devices, and moreover, it may be an electronics device having a semiconductor element formed by the peeling process of the present invention.

Semiconductor element groups constitute a display portion, a driving circuit portion or the like and are formed according to the peeling process of the present invention.

Figure 7B:
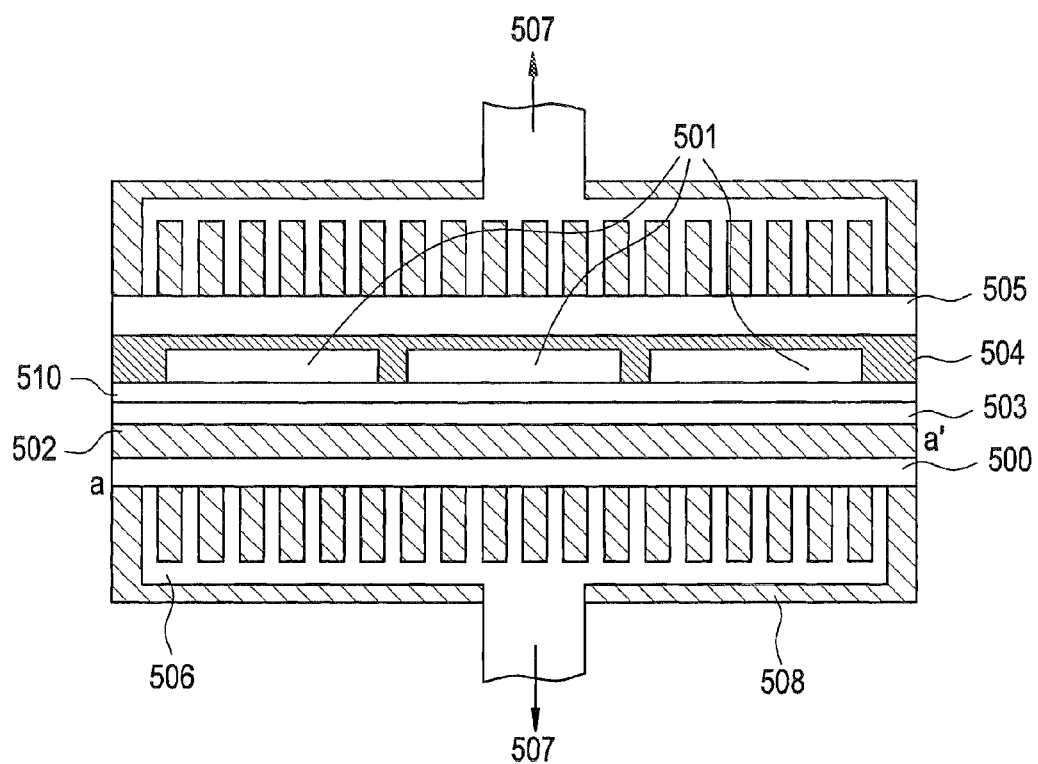

Mass production efficiency is improved by using a large-size substrate as the first substrate and by manufacturing plural display devices or semiconductor elements. However, it is preferable to use a device having a pressure reduction function (a pressure reduction device) as shown in FIG. 7(B) since there is a possibility that it becomes difficult to peel the first substrate or the second substrate uniformly. FIG. 7(B) shows a cross-sectional view taken along the line a-a' and a step for peel the second substrate. In other words, a metal film 502, a display device or semiconductor element groups 501 formed through a metal oxide film 503 and a second substrate 505 formed on the display device or the semiconductor element groups are provided over the first substrate 500. Preferably, a stress relaxation material 504 may be provided so as to cover the display device or the semiconductor element groups. Then a pressure reduction device 508 having vacancies 506 connected with a pump 507 is fixed. An auxiliary substrate or the like may be arranged between the first substrate and the pressure reduction device. Moreover, it is preferable to arrange a pressure reduction device also on the second substrate side and to fix it. Then, the state inside the vacancies become pressure reduced or vacuumed. Therefore, the first substrate can be peeled uniformly because the first substrate or the second substrate can be absorbed with constant suction power. In addition, the cross-section of the peeled plane may be exposed and the cross-section may be damaged with a cutter or the like. Afterwards, even though transferring to a third substrate is performed, it may be carried out in a state in which the second substrate is being absorbed. In that case, peeling or curing the adhesive is performed by radiating an ultraviolet ray or heating with the third substrate is being fixed to the pressure reduction device to transfer the absorbed second substrate. At this time, the pressure reduction device may be formed of a material which transmits an ultraviolet ray. It is sometimes difficult to fix the film substrate corresponding to the third substrate uniformly since it is flexible. However, transferring, peeling and even manufacturing of a display device can be performed precisely and simply by fixing uniformly with a pressure reduction device or the like.

The present embodiment mode can be combined with any of Embodiment Modes 1 through 4.

Embodiment Mode 10

The present invention can be adopted to display portions of various types of electronics devices. As electronics devices, portable information terminals (such as cellular phones; mobile computers; sheet computers; wearable computers; portable video game players and electronic notebooks), video cameras, digital cameras, goggle type displays, displays, navigation systems and the like are given as examples. An operative example of the electronic devices is shown in FIG. 8.

Figure 8A:
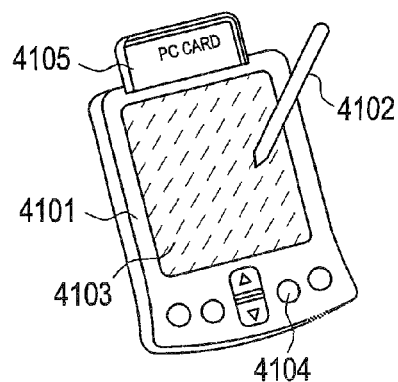
FIGS. 8A to 8F are drawings of explaining an electronics device of the present invention.

FIG. 8(A) illustrates a mobile computer which includes a main body 4101, a stylus 4102, a display portion 4103, operation buttons 4104, an external interface 4105 and the The display device of the present invention is used for the display portion 4103. A mobile computer which is light-weight, thin and hard to damage in being dropped can be provided according to the present invention. Moreover, a display portion may have a curved surface since the display device of the present invention is sufficient flexibility.

Figure 8B:
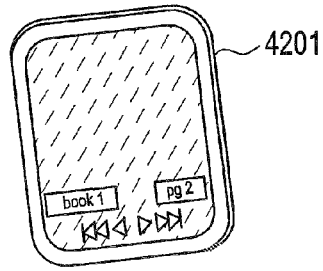

FIG. 8(B) illustrates an electronic book reader which includes a display portion 4201 and the like. The display device of the present invention is used for a display portion 4202. An electronic book reader which is light-weigh, thin and hard to damage in being dropped can be provided according to the present invention. Moreover, the display device of the present invention can be used as a display portion of a two-page spread electronic book, an electronic roll-up book or the like since it has sufficient flexibility.

Figure 8C:
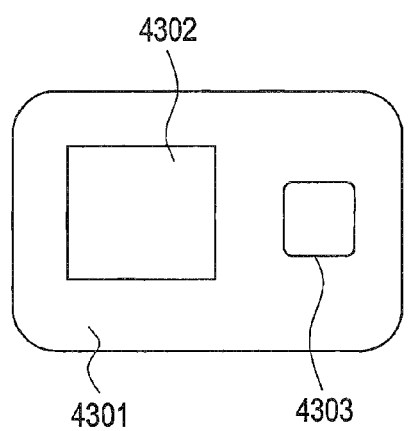

FIG. 8(C) illustrates an IC card which includes a main body 4301, a display portion 4302, an integrated circuit portion 4303 and the like. The display device of the present invention is used for the display portion 4302. It becomes possible to provide a display portion on an extremely thin IC card according to the present invention. In addition, a semiconductor element of the integrated circuit portion may be manufactured by using the peeling method of the present invention.

Figure 8D:
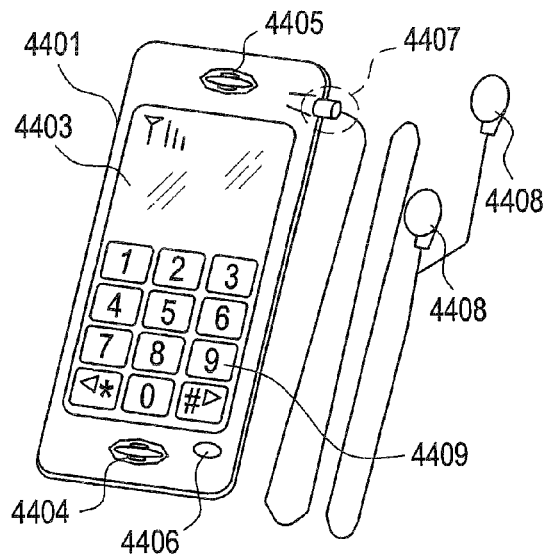

FIG. 8(D) illustrates a sheet-type cellular phone which includes a main body 4401, a display portion 4403, a voice input portion 4404, a voice output portion 4405, a switch 4406, an external connection port 4407 and the like. It can be connected with earphones 4408 that is prepared separately through the external connection port 4407. A display device formed according to the present invention is used for the display portion 4403 which is a touch panel type provided with a sensor. Therefore, a series of operations can be performed by touching a touch-panel type operation keys 4409 displayed on the display portion 4403. In addition, a thin film circuit formed by the present invention may be used as a various signal processing circuit provided inside the main body 4401. A cellular phone which is light-weight, thin and hard to damage in being dropped can be provided according to the present invention.

Figure 8E:
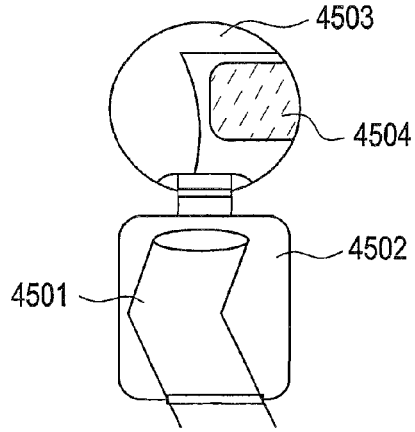
Figure 8F:
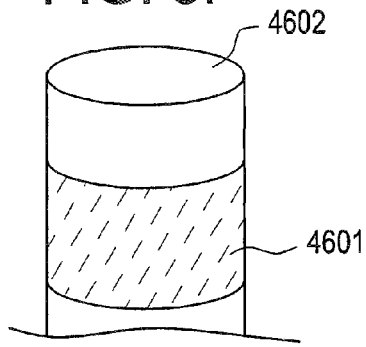

FIG. 8(E) illustrates a robot which includes an arm portion 4501, a trunk portion 4502, a head portion 4503, a display portion 4504 and the like. The display device of the present invention is used for the display portion 4504. FIG. 8(F) is an advertising pillar 4602 provided with a display portion 4601. The present invention is used for the display portion 4601. Moreover, the display portion of the present invention may be fixed on a window of a car or the like. In this way, the display device of the present invention has an effect that it can be used with being secured to a round substrate, since it has a feature of flexibility.

As above, the present invention is applicable to extremely wide range and can be utilized to electronics devices in all fields. In particular, the present invention that realizes thin or light-weight is extremely efficient to electronics devices of FIG. 8(A) through (F).

Embodiment Mode 11

A panel mounted with a pixel portion, a driver circuit for controlling the pixel portion, a memory circuit, and a CPU comprising a control unit and an arithmetic unit over the same insulating surface will be explained in this present embodiment. In other words, a driving circuit, a logical circuit or the like can be formed in addition to the display portion according to the peeling process of the present invention.

Figure 9:
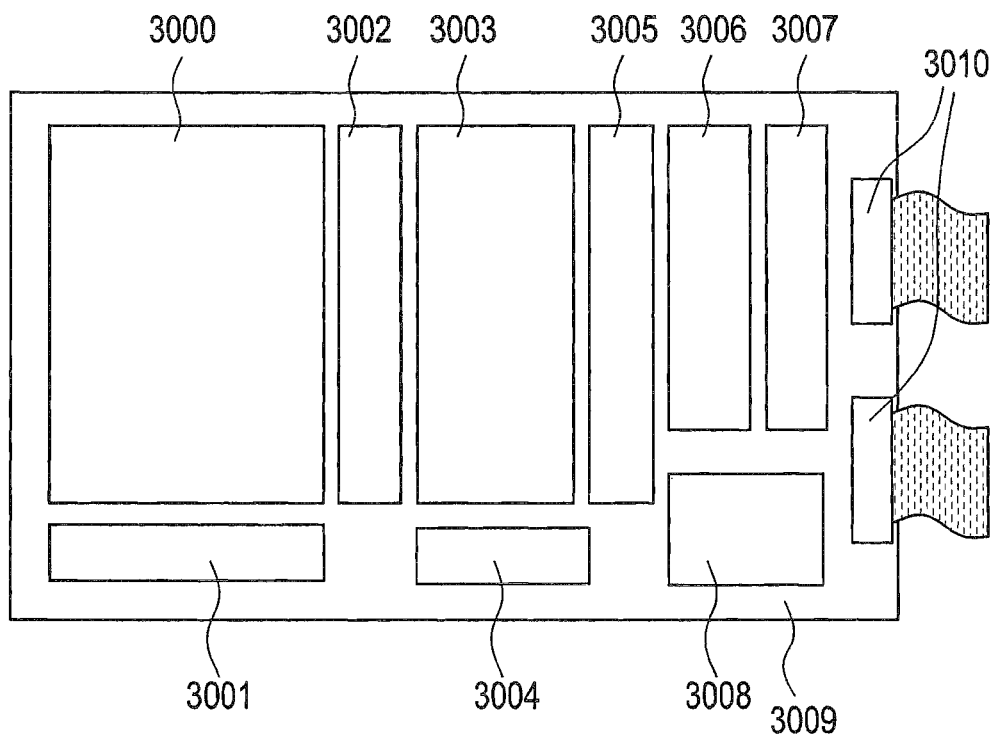
FIG. 9 is a drawing of explaining an electronics device of the present invention.

FIG. 9 shows the appearance of a panel. The panel has a pixel portion 3000 where plural pixels are arranged in matrix over a substrate 3009. A scanning line driver circuit 3001 and a signal line driver circuit 3002 for controlling the pixel portion 3000 are provided at the periphery of the pixel portion 3000. In the pixel portion 3000, an image is displayed according to a signal supplied from the driver circuit.

The counter substrate may be provided only over the pixel portion 3000 and the driver circuits 3001 and 3002, or may be provided over the entire surface. Note that it is preferable that a CPU 3008 that may generate heat to be provided to be in contact with a heat sink.

Further, the panel also has a VRAM 3003 (video random access memory, display only memory) for controlling the driver circuits 3001 and 3002, and decoders 3004 and 3005 for controlling the VRAM 3003 at the periphery of the VRAM 3000. In addition, the panel has a RAM 3006, a decoder 3007 for controlling the RAM 3006 and the CPU 3008 at the periphery of the RAM 3006.

All elements constituting a circuit over the substrate 3009 are formed of a polycrystalline semiconductor (polysilicon) that has higher field-effect mobility and higher ON current than that of an amorphous semiconductor. Therefore, plural circuits can be formed into an integrated circuit over one insulating surface. A pixel portion 3001, driver circuits 3001 and 3002 and other circuits are formed over a supporting substrate first, and then peeled by the peeling method according to the present invention, then, pasted with each other thereby achieving an integrated structure over the flexible substrate 3009. Although the structure of the plural pixels arranged in the pixel portion is not limited, arrangement of VRAM 3003 and RAM 3006 may be omitted by providing SRAM for each of the plural pixels.

EMBODIMENT

Embodiment 1

In the present embodiment, the result of observation of an oxide layer with a TEM on the substrate and the semiconductor side after peeling is shown.

A W film with a thickness of 50 nm by sputtering, a silicon oxide film with 200 nm by sputtering, a silicon oxynitride film with 100 nm thick as an insulating film by a plasma CVD method and an amorphous silicon film with 50 nm thick as a semiconductor film by a plasma CVD method are sequentially laminated.

Figure 10A:
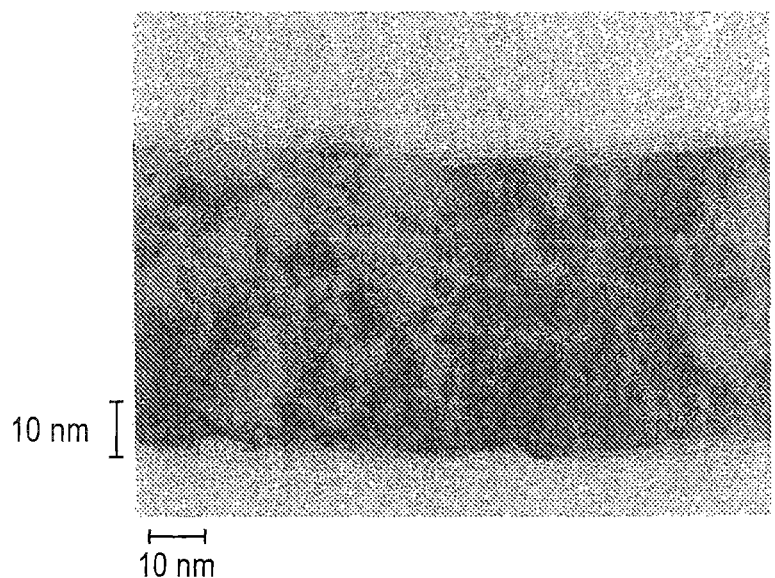
FIGS. 10A and 10B are drawings of showing a cross-sectional TEM photograph peeled according to the present invention.
Figure 10B:
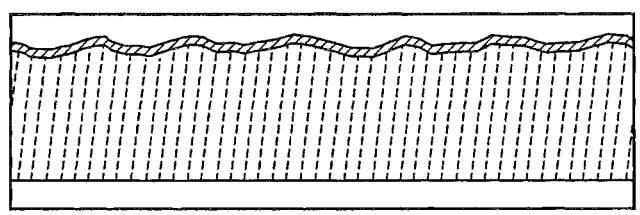
Figure 11A:
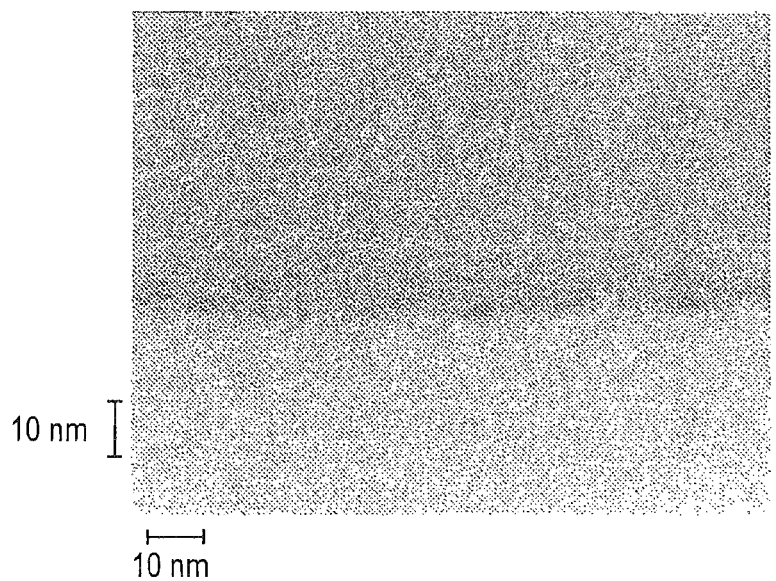
FIGS. 11A and 11B are drawings of showing a cross-sectional TEM photograph peeled according to the present invention.
Figure 11B:
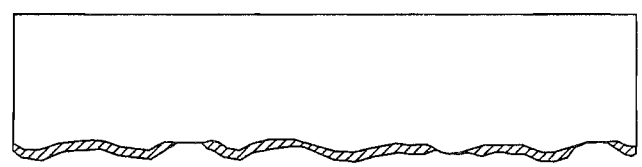

Afterwards, it is peeled by a physical means such as a polytetrafluoroethylene tape after conducting heat treatment for 1 hour at 500 degrees and for 4 hours at 550 degrees. FIG. 10 shows a TEM photograph of the W film and the oxide layer on the substrate side. FIG. 11 shows a TEM photograph of the oxide layer and the silicon oxide film on the semiconductor film side.

In FIG. 10, a metal oxide film remains unevenly in contact with the metal film. Likewise, also in FIG. 11, a metal oxide film remains unevenly in contact with the silicon oxide film It is demonstrated from the both TEM photographs that peeling is conducted inside of the layer of the metal oxide film and its both boundaries. In addition, it is understood that the metal oxide film is adhered to the metal film and the silicon oxide film and remains unevenly. Next, the peeled surfaces of the substrate side and the semiconductor film side after peeling are measured with XPS. Waveform separation is performed on the resultant spectrum. The obtained detection element and quantitative result are as follows.

On the semiconductor film side after peeling, W1 (tungsten W) and W2 (tungsten oxide $Wo_x$, X is almost 2) remains 0%; W3 (tungsten oxide $Wo_x$, 2<X<3) 16%; and W4 (tungsten oxide $WO_3$ or the like) 84%, on the contrary, on the substrate side where W1 remains 44%; W2, 5%; W3, 10% and W4, 42%.

Therefore, when peeling is conducted at the boundary between the metal oxide film and the metal film, at the boundary between the metal oxide film and the silicon oxide film, or inside the metal oxide film, it is understood that W1 and W2 remains all on the substrate side, two-thirds of W4 remains on the semiconductor film side and one-third remains on the substrate side. In other words, peeling easily occurs inside the metal oxide film, particularly from the boundary of W3 or W4.

In addition, in the present experiment, there is no W2 on the semiconductor film side and W2 is adhered to the substrate side. However, a case in which W2 is adhered to the semiconductor film side and there is no W2 on the substrate side can be conceivable conversely.

That is, it is conceivable that a metal oxide film is dotted between a film substrate and a single base film or a laminated base film provided under a semiconductor film when a display device or the like according to the present invention is manufactured, and it is transferred to the film substrate with a state in which the metal oxide film is adhered a little on the semiconductor film side.

What is claimed is:

1. A method for manufacturing a display device, the method comprising the steps of:
    forming a metal film and a metal oxide film over a first substrate;
    forming a peel-off layer over the metal film and the metal oxide film, the peel-off layer comprising a transistor, a first electrode in electrical contact with one of a source and a drain of the transistor, and an insulating layer;
    forming a water-soluble resin over the peel-off layer;
    fixing a tape over the water-soluble resin, the tape having a feature of deterioration in adhesiveness by being irradiated with an ultraviolet ray;
    separating the first substrate from the peel-off layer by using a physical means;
    fixing a second substrate under the peel-off layer by using an adhesive;
    irradiating an ultraviolet ray to the tape;
    separating the tape from the water-soluble resin;
    removing the water-soluble resin by using water;
    forming a light emitting layer on the peel-off layer by evaporation;
    forming a second electrode on the light emitting layer;
    forming a sealing film over the second electrode.

2. The method for manufacturing a display device according to claim 1,
    wherein a heat treatment is applied to the metal oxide film to crystallize the metal oxide film prior to the step of separating the first substrate.

3. The method for manufacturing a display device according to claim 1,
    further comprising a step of forming a UV protective film.

4. The method for manufacturing a display device according to claim 1,
    further comprising a step of forming a color filter,
    wherein the light emitting layer is a white light emitting layer.

5. The method for manufacturing a display device according to claim 1,
wherein the display device is a bottom-emission flexible light-emitting device.

6. The method for manufacturing a display device according to claim 1,
wherein the second electrode comprises ITO, and
wherein the display device is a top-emission flexible light-emitting device.

7. The method for manufacturing a display device according to claim 1,
wherein the display device is a bottom-emission flexible light-emitting device.

8. A method for manufacturing a display device, the method comprising the steps of:
forming a metal film comprising tungsten and a metal oxide film comprising tungsten over a glass substrate;
forming a peel-off layer over the metal film and the metal oxide film, the peel-off layer comprising a transistor, a first electrode in electrical contact with one of a source and a drain of the transistor, and an insulating layer;
forming a water-soluble resin over the peel-off layer;
fixing a tape over the water-soluble resin, the tape having a feature of deterioration in adhesiveness by being irradiated with an ultraviolet ray;
separating the glass substrate from the peel-off layer by using a physical means;
fixing a film substrate under the peel-off layer by using an epoxy resin system adhesive;
irradiating an ultraviolet ray to the tape;
separating the tape from the water-soluble resin;
removing the water-soluble resin by using water;
forming a light emitting layer on the peel-off layer by evaporation;
forming a second electrode on the light emitting layer;
forming a sealing film over the second electrode.

9. The method for manufacturing a display device according to claim 8,
wherein a heat treatment is applied to the metal oxide film to crystallize the metal oxide film prior to the step of separating the glass substrate.

10. The method for manufacturing a display device according to claim 8,
further comprising a step of forming a UV protective film.

11. The method for manufacturing a display device according to claim 8,
further comprising a step of forming a color filter,
wherein the light emitting layer is a white light emitting layer.

12. The method for manufacturing a display device according to claim 8,
wherein the display device is a bottom-emission flexible light-emitting device.

13. The method for manufacturing a display device according to claim 8,
wherein the second electrode comprises ITO, and
wherein the display device is a top-emission flexible light-emitting device.

14. The method for manufacturing a display device according to claim 8,
wherein the display device is a bottom-emission flexible light-emitting device.

15. A method for manufacturing a display device, the method comprising the steps of:
forming a metal film comprising tungsten and a metal oxide film comprising tungsten over a glass substrate;
forming a peel-off layer over the metal film and the metal oxide film, the peel-off layer comprising a transistor, a first electrode, and an insulating layer comprising an organic material covering edge portions of the first electrode;
forming a water-soluble resin over the peel-off layer;
fixing a tape over the water-soluble resin, the tape having a feature of deterioration in adhesiveness by being irradiated with an ultraviolet ray;
separating the glass substrate from the peel-off layer by using a physical means;
fixing a film substrate under the peel-off layer by using an epoxy resin system adhesive;
irradiating an ultraviolet ray to the tape;
separating the tape from the water-soluble resin;
removing the water-soluble resin by using water;
forming a white light emitting layer on the peel-off layer by evaporation;
forming a second electrode on the white light emitting layer; and
forming a sealing film over the second electrode.

16. The method for manufacturing a display device according to claim 15,
wherein a heat treatment is applied to the metal oxide film to crystallize the metal oxide film prior to the step of separating the glass substrate.

17. The method for manufacturing a display device according to claim 15,
further comprising a step of forming a UV protective film.

18. The method for manufacturing a display device according to claim 15,
further comprising a step of forming a color filter.

19. The method for manufacturing a display device according to claim 15,
wherein the display device is a bottom-emission flexible light-emitting device.

20. The method for manufacturing a display device according to claim 15,
wherein the second electrode comprises ITO, and
wherein the display device is a top-emission flexible light-emitting device.

21. The method for manufacturing a display device according to claim 15,
wherein the display device is a bottom-emission flexible light-emitting device.

22. A method for manufacturing a light emitting device, the method comprising the steps of:
forming a metal layer over a first substrate;
forming a metal oxide film and a base film on the metal layer, the metal oxide film in contact with the metal layer;
forming a semiconductor film over the base film;
performing a thermal treatment to crystallize the metal oxide film and the semiconductor film;
forming a source region and a drain region in the semiconductor film after having performed the thermal treatment;
forming an electrode electrically connected to one of the source region and the drain region;
forming an insulating layer covering an end of the electrode;
fixing a second substrate over the insulating layer;
separating the first substrate from the semiconductor film;
fixing a third substrate under the semiconductor film;
separating the second substrate from the electrode;
forming a light emitting layer on the electrode; and
forming a pixel electrode on the light emitting layer.

23. The method for manufacturing a light emitting device according to claim 22, further comprising the step of forming a water-soluble resin or a thermosetting resin before fixing the second substrate.

24. The method for manufacturing a light emitting device according to claim 22,
wherein the third substrate is a plastic substrate or a substrate with flexibility.

25. The method for manufacturing a light emitting device according to claim 22,
wherein the metal layer is a tungsten layer and the metal oxide film is a tungsten oxide layer.

26. The method for manufacturing a light emitting device according to claim 22,
wherein the metal layer is a tungsten layer and the metal oxide film is a tungsten oxide layer, and
wherein after the step of separating the first substrate, a concentration in WO3 is higher than a concentration of WO2 in metal oxide remaining on the side of the semiconductor film.

27. The method for manufacturing a light emitting device according to claim 22,
wherein the first substrate, and the semiconductor film are divided prior to the step of separating the first substrate from the semiconductor film.

28. A method for manufacturing a light emitting device, the method comprising the steps of:
forming a metal layer over a first substrate;
forming a metal oxide film and a base film on the metal layer, the metal oxide film in contact with the metal layer;
forming a semiconductor film over the base film;
performing a thermal treatment to crystallize the metal oxide film and the semiconductor film;
forming a source region and a drain region in the semiconductor film after having performed the thermal treatment;
forming an electrode electrically connected to one of the source region and the drain region;
forming an insulating layer covering an end of the electrode;
fixing a second substrate over the insulating layer;
separating the first substrate from the semiconductor film from the inside of the crystallized metal oxide film or from boundaries of both sides of the metal oxide film;
fixing a third substrate under the semiconductor film;
separating the second substrate from the electrode;
forming a light emitting layer on the electrode; and
forming a pixel electrode on the light emitting layer.

29. The method for manufacturing a light emitting device according to claim 28, further comprising the step of forming a water-soluble resin or a thermosetting resin before fixing the second substrate.

30. The method for manufacturing a light emitting device according to claim 28,
wherein the third substrate is a plastic substrate or a substrate with flexibility.

31. The method for manufacturing a light emitting device according to claim 28,
wherein the metal layer is a tungsten layer and the metal oxide film is a tungsten oxide layer.

32. The method for manufacturing a light emitting device according to claim 28,
wherein the metal layer is a tungsten layer and the metal oxide film is a tungsten oxide layer, and
wherein after the step of separating the first substrate, a concentration in WO3 is higher than a concentration of WO2 in metal oxide remaining on the side of the semiconductor film.

33. The method for manufacturing a light emitting device according to claim 28,
wherein the first substrate, and the semiconductor film are divided prior to the step of separating the first substrate from the semiconductor film.

* * * * *

UNITED STATES PATENT AND TRADEMARK OFFICE
CERTIFICATE OF CORRECTION

| | |
|---|---|
| PATENT NO. | : 8,508,682 B2 |
| APPLICATION NO. | : 13/547360 |
| DATED | : August 13, 2013 |
| INVENTOR(S) | : Shunpei Yamazaki et al. |

Page 1 of 1

It is certified that error appears in the above-identified patent and that said Letters Patent is hereby corrected as shown below:

In the Specification

At column 3, line 11, "Ike" should be --like--;

At column 4, line 62, "FIG. 11 is a drawing" should be deleted;

At column 13, line 61, "fanned" should be --formed--;

At column 13, line 66, "fowl" should be --form--;

At column 15, line 12, "fast" should be --first--; and

At column 20, line 6, "the The" should be --the like. The--.

Signed and Sealed this
Nineteenth Day of November, 2013

Teresa Stanek Rea
*Deputy Director of the United States Patent and Trademark Office*

UNITED STATES PATENT AND TRADEMARK OFFICE
CERTIFICATE OF CORRECTION

PATENT NO. : 8,508,682 B2
APPLICATION NO. : 13/547360
DATED : August 13, 2013
INVENTOR(S) : Shunpei Yamazaki et al.

It is certified that error appears in the above-identified patent and that said Letters Patent is hereby corrected as shown below:

In the Specification

At column 13, line 24, "FIG. 12 (H)," should be --FIG.12 (G),--;

At column 13, line 33, "FIG. 12 (I)," should be --FIG.12 (H),--;

At column 13, line 60, "FIG. 12 (J)," should be --FIG.12 (I),--.

Signed and Sealed this
Seventh Day of October, 2014

Michelle K. Lee
*Deputy Director of the United States Patent and Trademark Office*